(12) United States Patent
Yi

(10) Patent No.: US 11,373,708 B2
(45) Date of Patent: Jun. 28, 2022

(54) MEMORY DEVICE AND METHOD OF OPERATING THE SAME

(71) Applicant: SK hynix Inc., Icheon-si (KR)

(72) Inventor: Su Min Yi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/173,008

(22) Filed: Feb. 10, 2021

(65) Prior Publication Data

US 2022/0051725 A1 Feb. 17, 2022

(30) Foreign Application Priority Data

Aug. 14, 2020 (KR) .................. 10-2020-0102725

(51) Int. Cl.
| | | |
|---|---|---|
| *G11C 16/14* | (2006.01) | |
| *G11C 16/30* | (2006.01) | |
| *G11C 16/08* | (2006.01) | |
| *G11C 11/56* | (2006.01) | |
| *G11C 16/04* | (2006.01) | |

(52) U.S. Cl.
CPC .............. *G11C 16/14* (2013.01); *G11C 16/08* (2013.01); *G11C 16/30* (2013.01); *G11C 11/5635* (2013.01); *G11C 11/5671* (2013.01); *G11C 16/0483* (2013.01)

(58) Field of Classification Search
CPC ......... G11C 16/14; G11C 16/08; G11C 16/30; G11C 11/5635; G11C 11/5671; G11C 16/0483
See application file for complete search history.

(56) References Cited

U.S. PATENT DOCUMENTS

| | | | | |
|---|---|---|---|---|
| 9,223,514 | B2 * | 12/2015 | Hyun | G06F 3/0652 |
| 10,861,558 | B2 * | 12/2020 | Park | G11C 16/16 |
| 2013/0124792 | A1 * | 5/2013 | Melik-Martirosian | |
| | | | | G11C 11/5635 |
| | | | | 365/185.11 |
| 2017/0168752 | A1 * | 6/2017 | Micheloni | G06F 3/0688 |
| 2020/0126625 | A1 * | 4/2020 | Park | G11C 16/10 |

FOREIGN PATENT DOCUMENTS

| | | | | | |
|---|---|---|---|---|---|
| CN | 111091859 | A | * | 5/2020 | ......... G11C 16/0483 |
| CN | 111105829 | A | * | 5/2020 | ........... G06F 3/0604 |
| KR | 20150091670 | A | * | 8/2015 | ............ G11C 16/14 |
| KR | 1020180060885 | A | | 6/2018 | |
| KR | 1020180121898 | A | | 11/2018 | |

\* cited by examiner

*Primary Examiner* — Jay W. Radke
(74) *Attorney, Agent, or Firm* — William Park & Associates Ltd.

(57) ABSTRACT

A memory device having a plurality of memory blocks compensates for a characteristic change of a memory cell due to stopping an erase operation. The memory device also includes a voltage generator configured to generate voltages used by the memory device in performing an erase operation on a selected memory block among the plurality of memory blocks. The memory device further includes an erase stop controller configured to control stopping and resuming the erase operation, and counting the number of times the erase operation is stopped to generate a stop count value when the erase operation is stopped. The memory device additionally includes a count value storage configured to store and output the stop count value.

18 Claims, 21 Drawing Sheets

FIG. 8B

| GROUP | NO GROUPING | GROUPING |
|---|---|---|
| GROUP11 | 0.3V | 0.6V |
| GROUP12 | 0.3V | 0.5V |
| GROUP13 | 0.3V | 0.4V |
| GROUP14 | 0.3V | 0.3V |
| GROUP15 | 0.3V | 0.2V |
| GROUP16 | 0.3V | 0.1V |

FIG. 9B

| GROUP | NO GROUPING | GROUPING |
|---|---|---|
| GROUP21 | 0.3V | 0.1V |
| GROUP22 | 0.3V | 0.2V |
| GROUP23 | 0.3V | 0.3V |
| GROUP24 | 0.3V | 0.3V |
| GROUP25 | 0.3V | 0.2V |
| GROUP26 | 0.3V | 0.1V |

FIG. 12

| SUS_COUNT_VAL | VOFFSET |
|---|---|
| SUS_COUNT_VAL < 100 | 0 |
| 100 ≤ SUS_COUNT_VAL < 300 | Vsa |
| 300 ≤ SUS_COUNT_VAL < 500 | Vsb |
| SUS_COUNT_VAL ≥ 700 | Vsc |

FIG. 13A

| GROUP | NO GROUPING | GROUPING |
|---|---|---|
| GROUP11 | 0.3V+Vsa (0.3V−Vsa) | 0.6V+Vsa (0.6V−Vsa) |
| GROUP12 | 0.3V+Vsa (0.3V−Vsa) | 0.5V+Vsa (0.5V−Vsa) |
| GROUP13 | 0.3V+Vsa (0.3V−Vsa) | 0.4V+Vsa (0.4V−Vsa) |
| GROUP14 | 0.3V+Vsa (0.3V−Vsa) | 0.3V+Vsa (0.3V−Vsa) |
| GROUP15 | 0.3V+Vsa (0.3V−Vsa) | 0.2V+Vsa (0.2V−Vsa) |
| GROUP16 | 0.3V+Vsa (0.3V−Vsa) | 0.1V+Vsa (0.1V−Vsa) |

FIG. 13B

| GROUP | NO GROUPING | GROUPING |
|---|---|---|
| GROUP21 | 0.3V+Vsb (0.3V−Vsb) | 0.1V+Vsb (0.1V−Vsb) |
| GROUP22 | 0.3V+Vsb (0.3V−Vsb) | 0.2V+Vsb (0.2V−Vsb) |
| GROUP23 | 0.3V+Vsb (0.3V−Vsb) | 0.3V+Vsb (0.3V−Vsb) |
| GROUP24 | 0.3V+Vsb (0.3V−Vsb) | 0.3V+Vsb (0.3V−Vsb) |
| GROUP25 | 0.3V+Vsb (0.3V−Vsb) | 0.2V+Vsb (0.2V−Vsb) |
| GROUP26 | 0.3V+Vsb (0.3V−Vsb) | 0.1V+Vsb (0.1V−Vsb) |

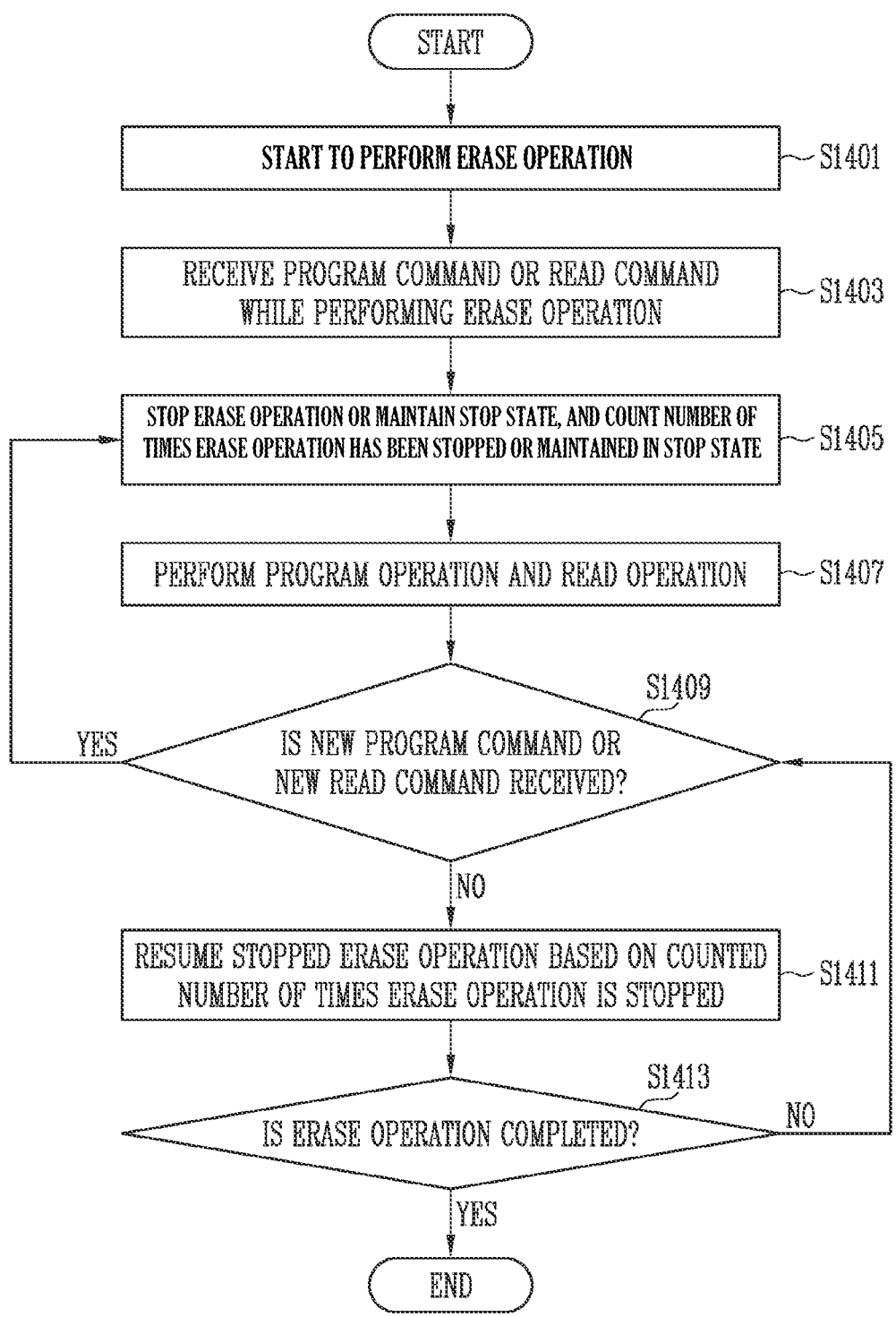

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0102725, filed on Aug. 14, 2020, in the Korean Intellectual Property Office, the entire disclosure of which is incorporated by reference herein.

BACKGROUND

1. Technical Field

The present disclosure relates to an electronic device, and more particularly, to a memory device and a method of operating the electronic device.

2. Related Art

A storage device is a device that stores data under the control of a host device, such as a computer, a smart phone, or a smart pad. The storage device, for example, may include a device that stores data on a magnetic disk such as a hard disk drive (HDD), a device that stores data in semiconductor memory such as a solid state drive (SSD), or a memory card, in particular, non-volatile memory.

The storage device may include a memory device in which data is stored and a memory controller that controls the storage of the data in the memory device. The memory device may be classified as a volatile memory device and a non-volatile memory device. Non-volatile memory device may include read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), or the like.

SUMMARY

An embodiment of the present disclosure is directed to a memory device that compensates for a characteristic change of a memory cell due to stopping an erase operation. Another embodiment is directed to a method of operating such a memory device.

A memory device according to an embodiment of the present disclosure includes a plurality of memory blocks. The memory device also includes a voltage generator configured to generate voltages used by the memory device in performing an erase operation on a selected memory block among the plurality of memory blocks. The memory device further includes an erase stop controller configured to control stopping and resuming the erase operation, and counting the number of times the erase operation is stopped to generate a stop count value when the erase operation is stopped. The memory device additionally includes a count value storage configured to store and output the stop count value.

A method of operating a memory device including a plurality of memory blocks includes performing an erase operation on a selected memory block among the plurality of memory blocks, stopping the erase operation when a program command or a read command is received while performing the erase operation, counting the number of times the erase operation is stopped to generate a stop count value when the erase operation is stopped, and resuming the erase operation based on the stop count value after an operation corresponding to the program command or the read command is completed.

According to the present technology, a characteristic change of a memory cell may be offset by counting the number of times the erase operation is stopped whenever the erase operation is stopped and differently setting an offset of the voltage applied to a word line during the erase operation based on the counted number of times the erase operation is stopped.

BRIEF DESCRIPTION OF THE DRAWINGS

FIGS. 8A and 8B is a diagram and a table, respectively, illustrating a voltage applied to the word lines during the erase operation in a memory cell array structure of FIG. 5.

FIGS. 9A and 9B is a diagram and a table, respectively, illustrating the voltage applied to the word lines during the erase operation in a memory cell array structure of FIG. 6.

FIG. 12 is a diagram illustrating an offset voltage determined according to a section to which a stop count value belongs.

FIGS. 13A and 13B are tables illustrating the voltage applied to each word line group according to the section to which the stop count value belongs and whether or not grouping is performed.

FIG. 14 is a flowchart illustrating a method of operation of the memory device according to an embodiment of the present disclosure.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described in detail with reference to the accompanying drawings, so that those skilled in the art to which the present disclosure pertains may carry out the technical spirit of the present disclosure.

Figure 1:
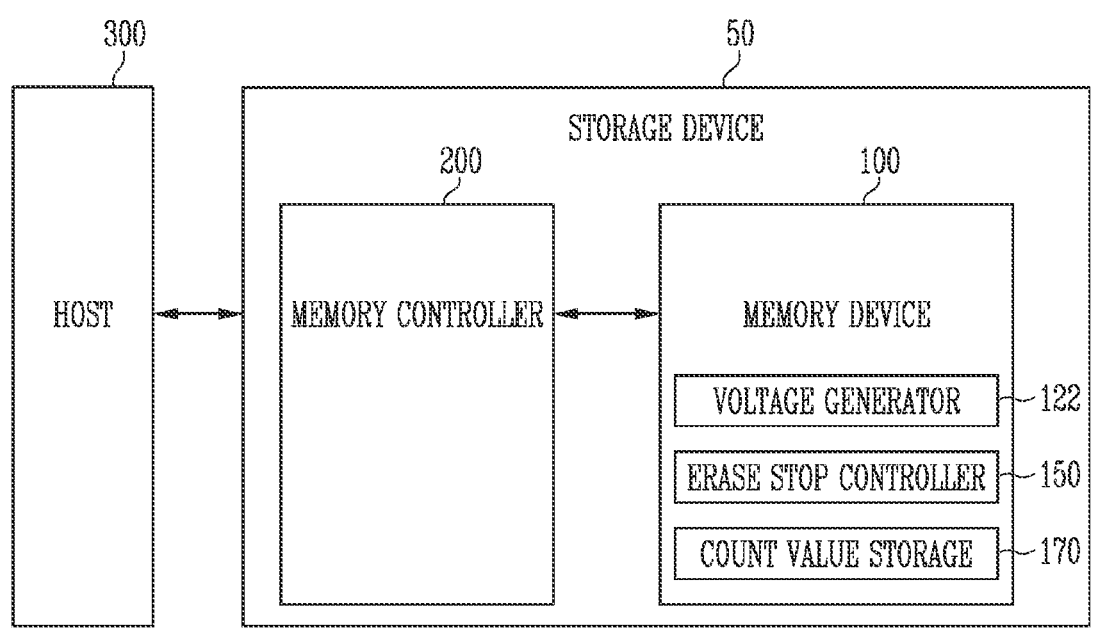
FIG. 1 is a block diagram illustrating a storage device.

FIG. 1 is a block diagram illustrating a storage device 50.

Referring to FIG. 1, the storage device 50 may include a memory device 100 and a memory controller 200.

The storage device 50 may be a device that stores data under the control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may include double data rate synchronous dynamic random access memory (DDR SDRAM), low power double data rate4 (LPDDR4) SDRAM, graphics double data rate (DDDR) SDRAM, low power DDR (LPDDR), Rambus dynamic random access memory (RDRAM), NAND flash memory, vertical NAND flash memory, NOR flash memory device, resistive random access memory (RRAM), phase-change memory (PRAM), magnetoresistive random access memory (MRAM), ferroelectric random access memory (FRAM), spin transfer torque random access memory (STT-RAM), or the like. In the present specification, for convenience of description, it is assumed that the memory device 100 includes NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer s configured of an insulating film.

In an embodiment, the memory device 100 may operate in a single-level cell (SLC) method in which one data bit is stored in one memory cell. Alternatively, the memory device 100 may operate according to a method of storing at least two data bits in one memory cell. For example, the memory device 100 may operate according to a multi-level cell (MLC) method of storing two data bits in one memory cell, a triple-level cell (TLC) method of storing three data bits in one memory cell, or a quadruple-level cell (QLC) method of storing four data bits in one memory cell.

The memory device 100 is configured to receive a command and an address from the memory controller 200 and access a region selected by the address in the memory cell array. That is, the memory device 100 may perform an operation corresponding to the command on the region selected by the address. For example, the memory device 100 may perform a write operation (program operation), a read operation, or an erase operation according to the received command. For example, when a program command is received, the memory device 100 may program data to the region selected by the address. When a read command is received, the memory device 100 may read data from the region selected by the address. When an erase command is received, the memory device 100 may erase data stored in the region selected by the address.

The memory device 100 may include a voltage generator 122. The voltage generator 122 may generate various voltages used for the program operation, the read operation, or the erase operation.

For example, when the erase operation on any one of the plurality of memory blocks included in the memory device 100 is performed, the voltage generator 122 may generate an erase voltage applied to a substrate, a voltage to be applied to a gate of each memory cell included in a corresponding memory block, and the like.

In an embodiment, because the memory blocks included in the memory device 100 have a three-dimensional structure, the number of memory blocks stacked on the substrate may increase. Furthermore, as the number of memory blocks stacked on the substrate increases, a characteristic of the memory cells included in the memory block may change.

That is, in the stacked structure, a charge transfer characteristic of the memory cells may be changed due to an interference or disturbance phenomenon between the memory cells. As the charge transfer characteristic of the memory cells is changed, during the erase operation, a voltage generation reflecting the changed characteristic may be required.

Accordingly, the voltage generator 122 may differently generate word line voltage levels to be applied to the gates of each memory cell during the erase operation.

For example, the memory cells may be divided into a plurality of groups according to whether the memory cells included in the memory block are positioned on an upper portion or a lower portion in a corresponding memory block, and the voltage generator 122 may generate the voltage applied to a word line by varying the voltage level for each group.

Furthermore, the voltage generator 122 may set the voltage level differently for each word line group, determine an offset voltage based on the number of times the erase operation is stopped, and generate a voltage of a level as high as the determined offset voltage.

As a result, in the present disclosure, the voltage generator 122 may generate the voltage to be applied for each word line group or all word lines connected to the memory block on which the erase operation is performed based on the number of times the erase operation is stopped.

The memory device 100 may include an erase stop controller 150. The erase stop controller 150 may control the stop of the erase operation being performed by the memory device 100 and resumption of the stopped erase operation.

In an embodiment, the erase stop controller 150 may control the memory device 100 to stop the erase operation in response to an erase stop command received from the memory controller 200. In addition, the erase stop controller 150 may control the memory device 100 to perform the stopped erase operation again, for example, to resume the stopped erase operation, in response to an erase resumption command received from the memory controller 200.

In an embodiment, each time the erase stop command is received from the memory controller 200, the erase stop controller 150 may count the number of times of the erase stop command is received. That is, the number of times the erase operation, which is being performed on the memory device 100, is stopped may be counted.

Furthermore, the erase stop controller 150 may output a stop count value, which is a value obtained by counting the number of times the erase operation is stopped, to a count value storage 170, and receive the stop count value from the count value storage 170. The erase stop controller 150 may output an operation signal instructing to generate the voltage to be applied to the word line during the erase operation based on the stop count value received from the count value storage 170.

The memory device 100 may include the count value storage 170. The count value storage 170 may be configured of volatile memory or non-volatile memory. In another embodiment, the count value storage 170 may be a portion of the plurality of memory blocks included in the memory cell array.

The count value storage 170 may store the stop count value, which is the value obtained by counting the number of times the erase operation is stopped. At this time, the stop count may be output from the erase stop controller 150. In addition, the count value storage 170 may output the stop count value to the erase stop controller 150 according to a request of the erase stop controller 150. The stop count value stored in the count value storage 170 may be reset when the stopped erase operation is completed.

The memory controller 200 may control an overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may converts the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 so as to perform background operations such as a program operation for wear leveling and a program operation for garbage collection.

In an embodiment, the storage device 50 may further include buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (DDDR) SDRAM, a low power DDR (LPDDR), or Rambus dynamic random access memory (DRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
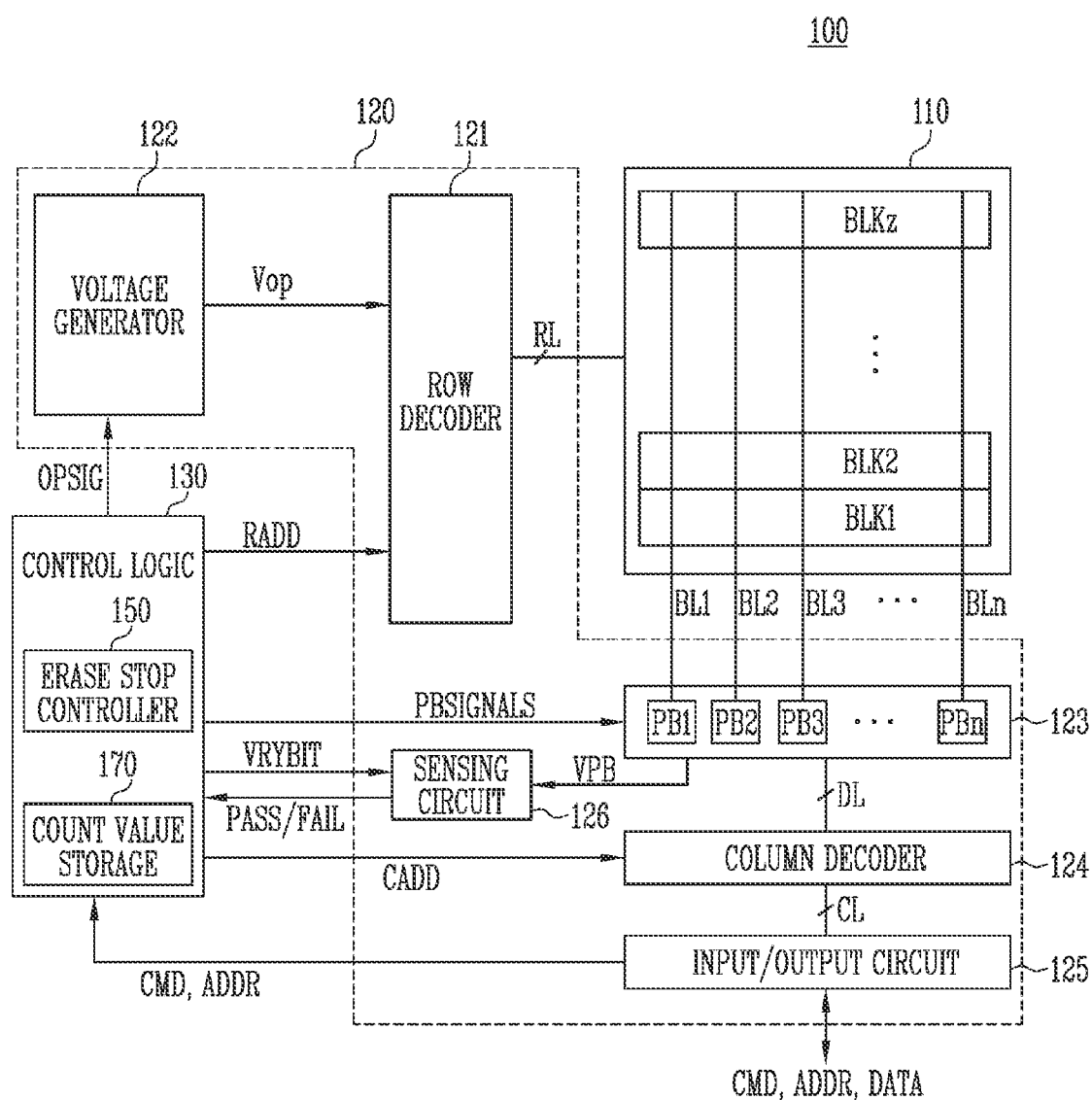
FIG. 2 is diagram illustrating a structure of a memory device of FIG. 1.

FIG. 2 is diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single-level cell (SLC) that stores one data bit, a multi-level cell (MLC) that stores two data bits, a triple-level cell (TLC) that stores three data bits, or a quadruple-level cell (QLC) that stores four data bits.

The peripheral circuit 120 may be configured to perform a program operation, a read operation, or an erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass signal PASS or the fail signal FAIL.

In an embodiment, the control logic 130 may include the erase stop controller 150 and the count value storage 170. In another embodiment, the count value storage 170 may be positioned outside the control logic 130 or may be configured of some of the plurality of memory blocks BLK1 to BLKz included in the memory cell array 110. The control logic 130 may be implemented as hardware, software, or a combination of hardware and software. For example, the control logic 130 may be a control logic circuit operating in accordance with an algorithm and/or a processor executing control logic code.

The erase stop controller 150 may control the stopping of the erase operation performed on the memory device 100 and the resumption of the stopped erase operation. For example, the erase stop controller 150 may control the memory device 100 to stop the erase operation being performed by the memory device 100 in response to the erase stop command received from the memory controller 200 of FIG. 1 and resume the stopped erase operation in response to the erase resumption command received from the memory controller 200 of FIG. 1. When the erase stop controller 150 stops the erase operation, an operation corresponding to the program command or the read command received from the memory controller 200 of FIG. 1 may be performed.

In addition, the erase stop controller 150 may generate and output a stop count value obtained by counting a number of times an erase operation is stopped. Whenever the erase operation is stopped, the stop count value may be incremented by one, and the cumulative count value may be reset again when the erase operation is completed. The output stop count value may be stored in the count value storage 170. Furthermore, the erase stop controller 150 may receive the stop count value stored in the count value storage 170 to perform the stopped erase operation again.

The count value storage 170 may be configured of volatile memory or non-volatile memory, and may store the stop count value. The stop count value may indicate the number of times the erase operation is stopped. In addition, the count value storage 170 may output the stored stop count value according to the request of the erase stop controller 150. The stopped erase operation may be performed again based on the output stop count value.

Figure 3:
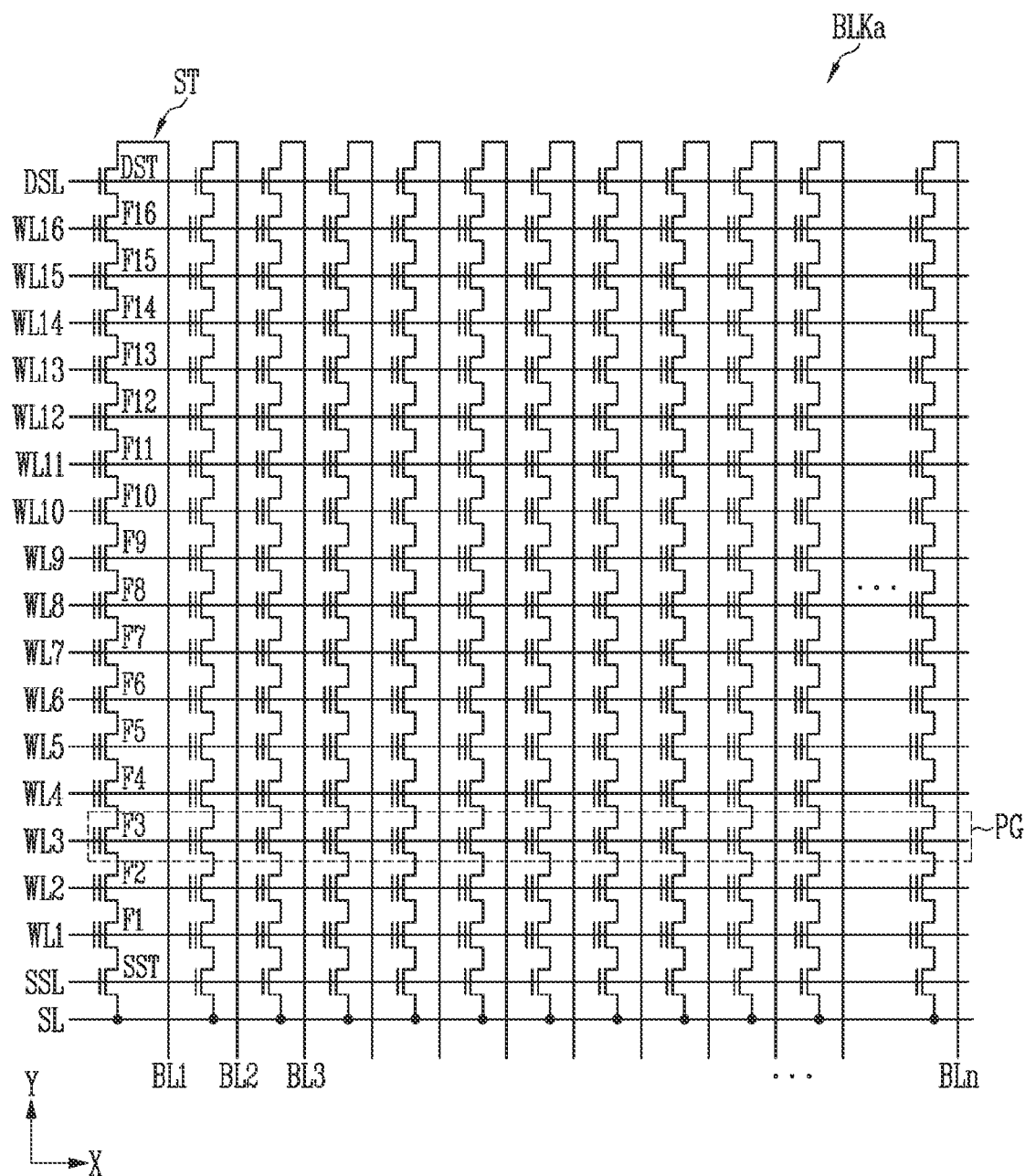
FIG. 3 is a diagram illustrating an embodiment of a memory cell array of FIG. 2.

FIG. 3 is a diagram illustrating an embodiment of the memory cell array of FIG. 2.

Referring to FIGS. 2 and 3, FIG. 3 is a circuit diagram showing any one memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Because the strings may be configured to be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the physical pages PPG of the number of the word lines WL1 to WL16.

One memory cell may store one bit of data. This is commonly referred to as a single-level cell (SLC). In this case, one physical page PPG may store one logical page (LPG) data. One logical page (LPG) data may include data bits of the number of memory cells included in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is referred to as a multi-level cell (MLC), but recently, as the number of bits of data stored in one memory cell increases, the multi-level cell (MLC) refers to a memory cell in which two bits of data is stored, a memory cell in which three or more bits of data are stored is referred to as a triple-level cell (TLC), and a memory cell in which four or more bits of data are stored is referred to as a quadruple-level cell (QLC). In addition, a memory cell method in which a plurality of bits of data are stored has been developed, and the present embodiment may be applied to the memory device 100 in which two or more bits of data are stored, FIG. 4 is a diagram illustrating another embodiment of the memory cell array 110 of FIG. 2.

Figure 4:
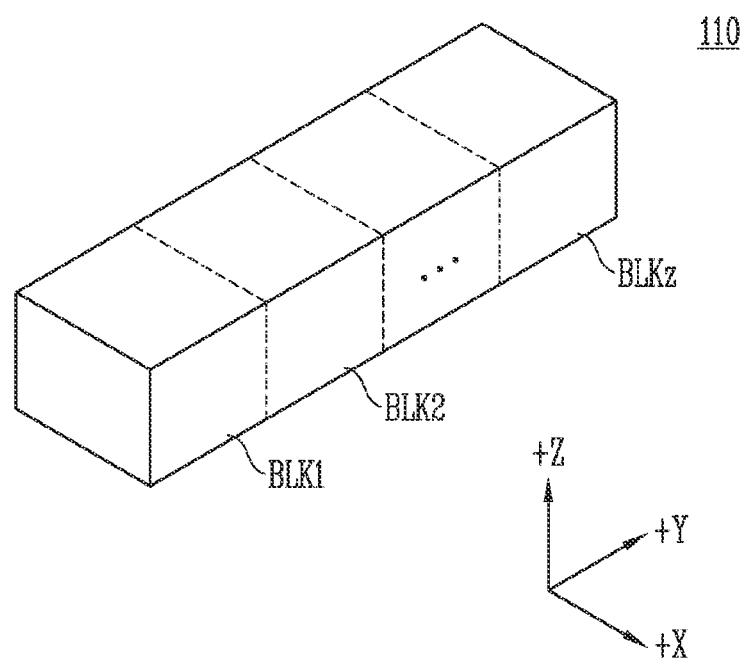
FIG. 4 is a diagram illustrating another embodiment of the memory cell array of FIG. 2.

Referring to FIG. 4, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 5 and 6.

Figure 5:
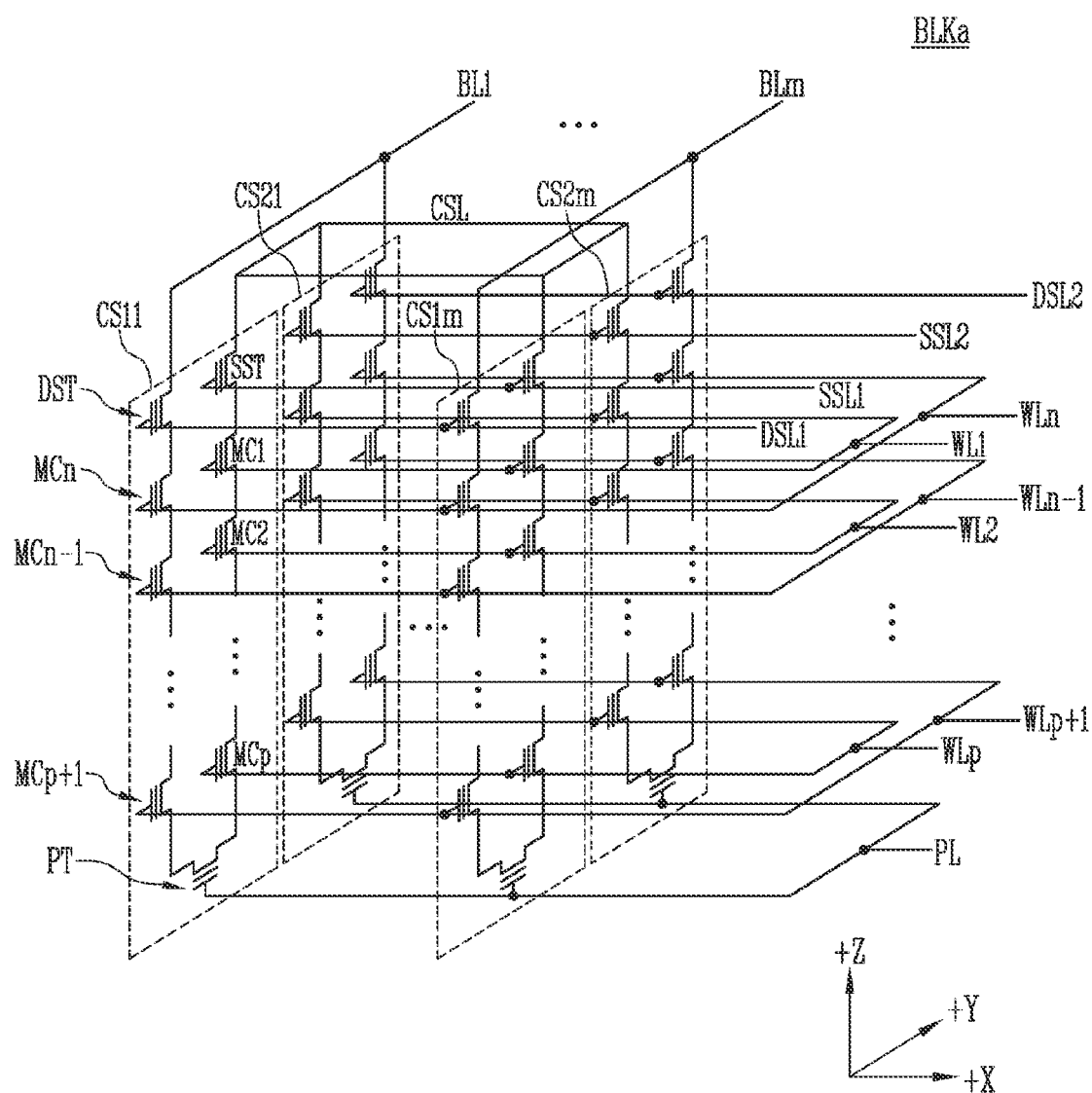
FIG. 5 is a circuit diagram illustrating any one memory block BLKa of memory blocks BLK1 to BLKz of FIG. 4.

FIG. 5 is a circuit diagram illustrating any one memory block BLKa of the memory blocks BLK1 to BLKz of FIG. 4.

Referring to FIG. 5, the memory block BLKa includes a plurality of cell strings CS11 to CS1*m* and CS21 to CS2*m*. As an embodiment, each of the plurality of cell strings CS11 to CS1*m* and CS21 to CS2*m* may be formed in a 'U' shape. In the memory block BLKa, m cell strings are arranged in a row direction (that is, the +X direction). In FIG. 5, two cell strings are arranged in a column direction (that is, the +Y direction). However, this is for convenience of description and it may be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 5, the source select transistors of the cell strings CS11 to CS1*m* of a first row are connected to a first source select line SSL1. The source select transistors of the cell strings CS21 to CS2*m* of a second row are connected to a second source select line SSL2.

As another embodiment, the source select transistors of the cell strings CS11 to CS1*m* and CS21 to CS2*m* may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1*m* of the first row are connected to a first drain select line DSL1. The drain select transistors of the cell strings CS21 to CS2*m* of the second row are connected to a second drain select line DSL2.

The cell strings arranged in the column direction are connected to the bit lines extending in the column direction. In FIG. 5, the cell strings CS11 and CS21 of the first column are connected to the first bit line BL1. The cell strings CS1*m* and CS2*m* of the m-th column are connected to the m-th bit line BLm.

The memory cells connected to the same word line in the cell strings arranged in the row direction configure one page. For example, the memory cells connected to the first word line WL1, among the cell strings CS11 to CS1*m* of the first row configure one page. The memory cells connected to the first word line WL1, among the cell strings CS21 to CS2*m* of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm.

In addition, even-numbered cell strings among the cell strings CS11 to CS1*m* or CS21 to SC2*m* arranged in the row direction may be connected to even the bit lines, and odd-numbered cell strings among the cell strings CS11 to CS1*m* or CS21 to CS2*m* arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 6:
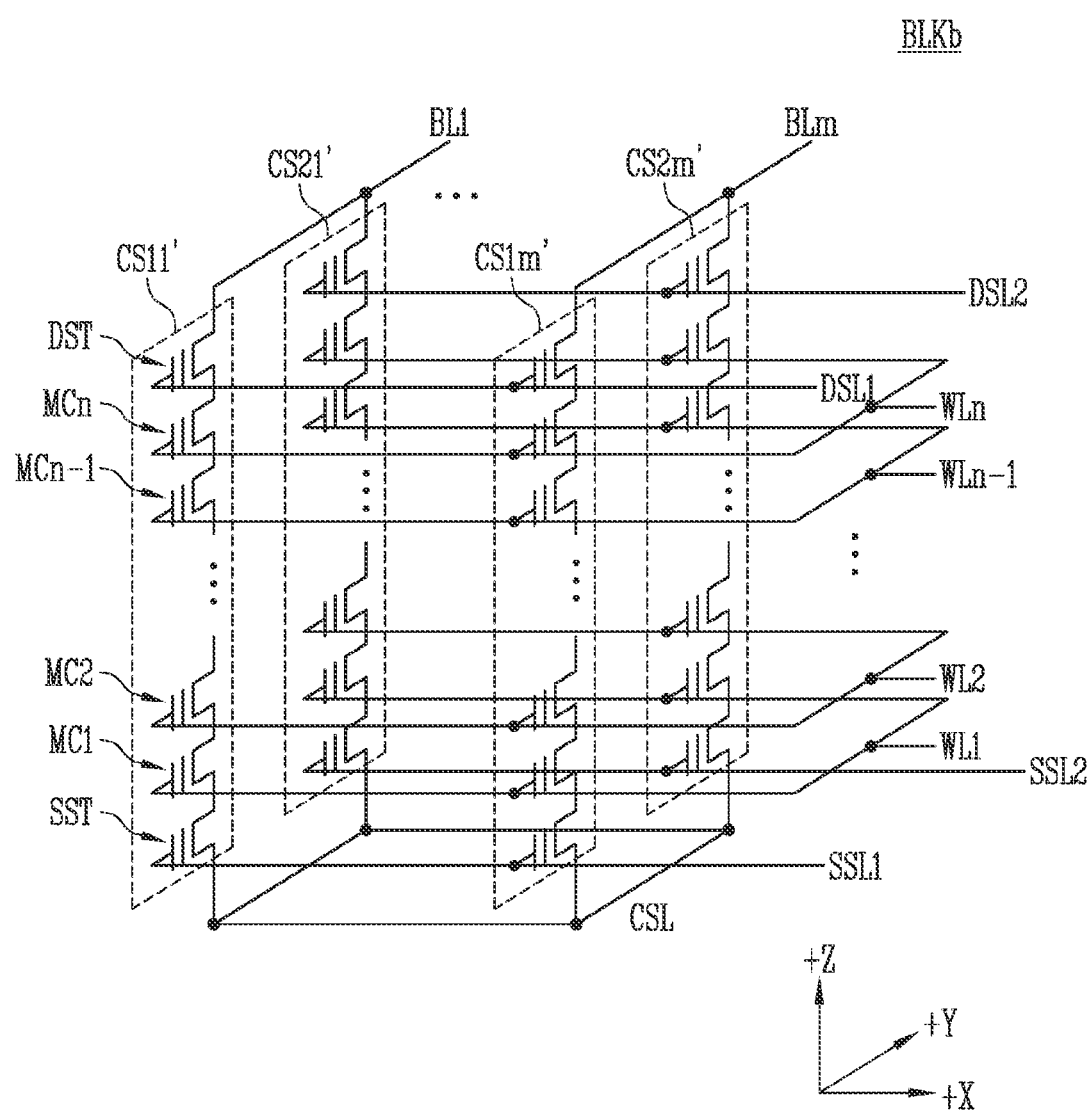
FIG. 6 is a circuit diagram illustrating any one memory block BLKb among the memory blocks BLK1 to BLKz of FIG. 4.

FIG. 6 is a circuit diagram illustrating any one memory block BLKb among the memory blocks BLK1 to BLKz of FIG. 4.

Referring to FIG. 6, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 6 has an equivalent circuit similar to that of the memory block BLKa of FIG. 5 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

In addition, in order to reduce an electric field between the source select transistor SST and the memory cells MC1 to MCn, at least one of the first to n-th memory cells MC1 to MCn may be used as a dummy memory cell.

Figure 7:
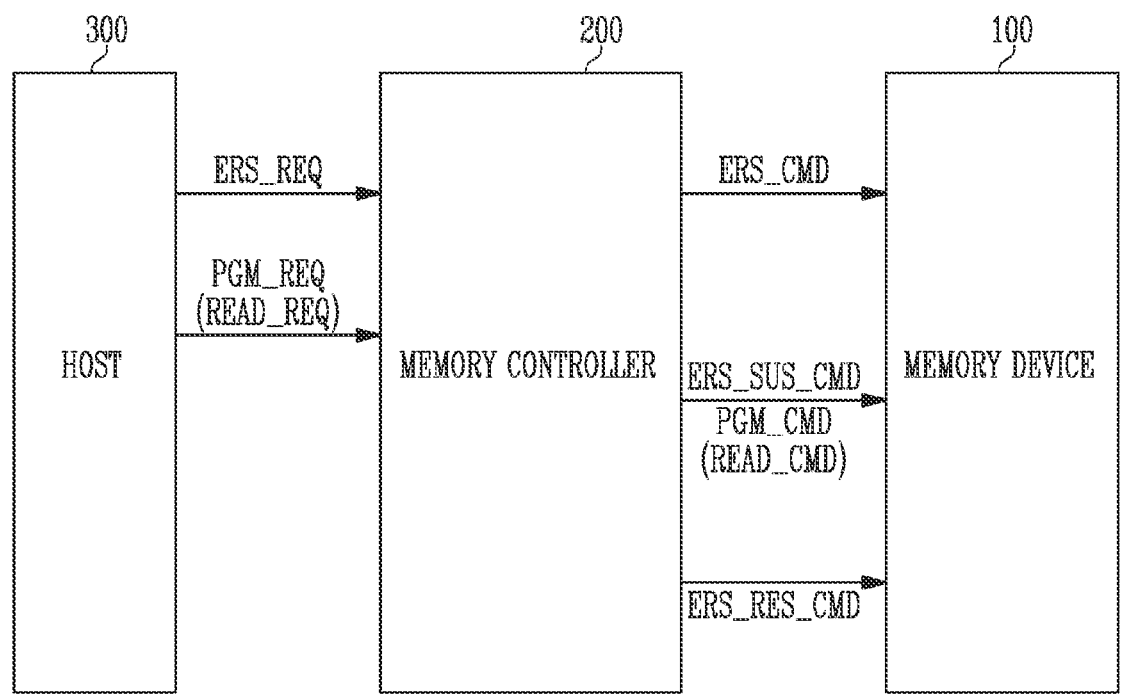
FIG. 7 is a diagram illustrating an operation of a memory controller of FIG. 1 when an erase operation is stopped and the stopped erase operation is resumed.

FIG. 7 is a diagram illustrating an operation of the memory controller 200 of FIG. 1 when the erase operation is stopped and the stopped erase operation is resumed.

FIG. 7 illustrates a process in which the erase operation is stopped while the memory device 100 performs the erase operation and a process in which the erase operation is performed again after the erase operation is stopped.

In an embodiment, the host 300 may output an erase request ERS_REQ to the memory controller 200. The erase request ERS_REQ may be a request for the plurality of memory cells included in any one of the plurality of memory blocks included in the memory device 100.

The memory controller 200 may output an erase command ERS_CMD to the memory device 100 in response to the erase request ERS_REQ received from the host 300. The memory device 100 may perform the erase operation on a memory block corresponding to the erase command ERS_CMD in response to the received erase command ERS_CMD.

However, while the memory device 100 performs the erase operation, a program request PGM_REQ or a read request READ_REQ may be received from the host 300. Here, the program request PGM_REQ may be a request for the memory cells included in a memory block other than the memory block on which the erase operation is being performed. In addition, the read request READ_REQ may be a request for memory cells included in the memory block on which the erase operation is being performed or another memory block.

In an embodiment, when the memory device 100 receives the program request PGM_REQ or the read request READ_REQ from the host 300 while performing the erase operation, the memory controller 200 may output an erase stop command ERS_SUS_CMD for stopping the erase operation to the memory device 100. That is, the memory controller 200 may control the memory device 100 to stop the erase operation being performed by the memory device 100 and perform the program operation or the read operation prior to the erase operation.

For example, when the erase operation is stopped, the memory controller 200 may output a program command PGM_CMD corresponding to the program request PGM_REQ or a read command READ_CMD corresponding to the read request READ_REQ to the memory device 100. After receiving the program command PGM_CMD or the read command READ_CMD, the memory device 100 may perform an operation corresponding to each command.

In an embodiment, when the memory controller 200 does not receive a new program request PGM_REQ or a new read request READ_REQ from the host 300 until the operation corresponding to the program command PGM_CMD or the read command READ_CMD is completed after the erase operation is stopped, the memory controller 200 may output an erase resumption command ERS_RES_CMD for resuming the stopped erase operation to the memory device 100. That is, after the erase operation is stopped, when all operations corresponding to the command received from the memory controller 200 are completed, the stopped erase operation may be performed again.

The memory device 100 may perform the stopped erase operation again based on the erase resumption command ERS_RES_CMD received from the memory controller 200. At this time, the memory device 100 may perform a new erase operation regardless of a previous erase operation. That is, the memory device 100 may perform the stopped erase operation from the beginning in response to the erase resumption command ERS_RES_CMD.

However, when the memory controller 200 receives the new program request PGM_REQ or the new read request READ_REQ from the host 300 again after the erase operation is resumed and before the erase operation is completed, the memory controller 200 may output the erase stop command ERS_SUS_CMD to the memory device 100 again. Thereafter, the memory device 100 may stop the erase operation in response to the erase stop command ERS_SUS_CMD and perform an operation corresponding to the new program command PGM_CMD or the new read command READ_CMD.

As described above, until the erase operation is completed, the memory device 100 may determine whether to resume the stopped erase operation while determining whether the new program command PGM_CMD or the new read command READ_CMD is received from the memory controller 200.

In an embodiment, when the memory controller 200 receives the new program request PGM_REQ or the new read request READ_REQ from the host 300 until the operation corresponding to the program command PGM_CMD or the read command READ_CMD is completed after the erase operation is stopped, the memory controller 200 may output a new program command PGM_CMD or a new read command READ_CMD corresponding to the new program request PGM_REQ or the new read request READ_REQ to the memory device 100. That is, the memory controller 200 may output the new program command PGM_CMD or the new read command READ_CMD to the memory device 100 without outputting the erase resumption command ERS_RES_CMD for resuming the stopped erase operation.

Therefore, the stopped erase operation might not be performed again until the program operation or the erase operation corresponding to the program request PGM_REQ or the read request READ_REQ, which is received before the erase operation is completed, is completed.

In an embodiment, as a speed of the program operation and the read operation increases, a time after the erase operation is stopped until the stopped erase operation is resumed may be reduced. That is, a repetition of the stop and the resumption of the erase operation may be accelerated. Therefore, a characteristic of the plurality of memory cells included in the memory block on which the erase operation is performed may be changed as the erase operation is stopped and resumed repeatedly. That is, as a charge transfer characteristic of the plurality of memory cells change, a cell speed may increase or decrease.

Therefore, as the time after the erase operation is stopped until the stopped erase operation is resumed is reduced, a voltage level to be applied to the word lines connected to the memory block on which the erase operation is performed is required to be changed during the erase operation.

The voltage level that changes as the time after the erase operation is stopped until the stopped erase operation is resumed is reduced is described in more detail with reference to FIGS. 8A and 8B and subsequent drawings.

Figure 8A:
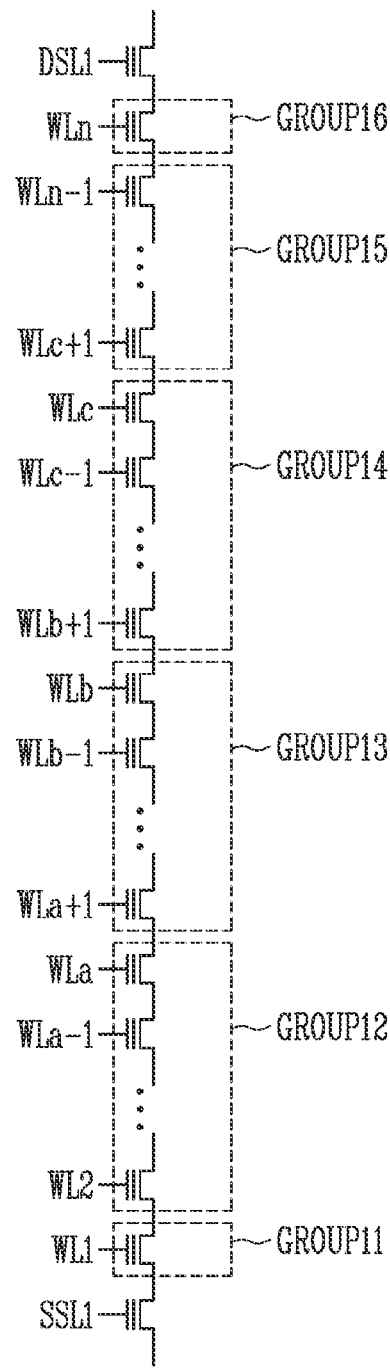

FIGS. 8A and 8B are diagrams illustrating the voltage applied to the word lines during the erase operation in the memory cell array structure of FIG. 5.

Referring to FIGS. 5, 8A, and 8B, FIG. 8A is a diagram in which the plurality of word lines WL1 to WLn connected to the memory cells of the cell string CS11 among the cell strings CS11 to CS1m of a first row of FIG. 5 are configured as a plurality of groups GROUP11 to 16. FIG. 8B illustrates the voltages applied to the word lines during the erase operation, when the word lines are not grouped (NO GROUPING) or when the word lines are grouped (GROUPING). In FIG. 8A, the word lines are divided into eleventh to sixteenth groups GROUP11 to 16, that is, six groups, but may be divided into a greater number or a lower number of groups in another embodiment.

Referring to FIG. 8A, the first to n-th word lines WL1 to WLn of FIG. 8A may be the word lines connected to the gates of the first to nth memory cells MC1 to MCn of FIG. 5, respectively. In addition, the gate of the drain select transistor DST of the cell string CS11 may be connected to the first drain select line DSL1, and the gate of the source select transistor SST may be connected to the first source select line SSL1.

As a result, the memory cells of the cell string CS11 may be configured of the drain select transistor DST, the source select transistor SST, and the first to n-th memory cells MC1 to MCn between the drain select transistor DST and the source select transistor SST. Furthermore, the first to nth memory cells MCl to MCn may be connected to the first to nth word lines WL1 to WLn, respectively.

In FIGS. 8A and 8B, in the memory cell array structure of FIG. 5, the first to n-th word lines WL1 to WLn may be divided into the eleventh to sixteenth groups GROUP11 to 16. In FIGS. 8A and 8B, the first word line WL1 may be included in the eleventh group GROUP11, second to a-th word lines WL2 to WLa may be included in the twelfth group GROUP12, (a+1)-th to b-th word lines WLa+1 to WLb may be included in the thirteenth group GROUP13, (b+1)-th to c-th word lines WLb+1 to WLc may be included in the fourteenth group GROUP14, (c+1)-th to (n−1)-th word lines WLc+1 to WLn−1 may be included in the fifteenth group GROUP15, and the n-th word line WLn may be included in the sixteenth group GROUP16.

In an embodiment, as the memory block has a three-dimensional structure, a width of a pillar of three-dimensional cell strings may decrease from an upper portion to a lower portion of the three-dimensional structure. In addition, as the memory block has the three-dimensional structure, interference and disturbance occurrence between the memory cells may increase.

Therefore, during the erase operation, the memory device 100 of FIG. 1 may divide the plurality of word lines connected to the memory block into the plurality of groups, and apply voltages of different levels to the word lines for each group.

In an embodiment, in the three-dimensional structure, during the erase operation, the memory device 100 of FIG. 1. may increase the voltage applied to the word line from the upper portion to the lower portion. In the three-dimensional structure, because a transferal of the charge may increase from the upper portion to the lower portion, the voltage level applied to the word line may increase from the upper portion to the lower portion during the erase operation. That is, in order to adjust an erase speed of upper and lower memory cells, voltages of different levels may be applied to upper and lower word lines.

Referring to FIG. 8B, a first column of FIG. 8B shows a word line group GROUP, a second column shows the voltage applied to the word lines when the word lines are not grouped during the erase operation (NO GROUPING), and a third column shows the voltage applied to the word lines when the word lines are grouped during the erase operation (GROUPING).

In an embodiment, when the word lines are not grouped during the erase operation (NO GROUPING), a voltage of the same level may be applied to all word lines, that is, the word lines included in the eleventh to sixteenth groups GROUP11 to 16. In FIG. 8B, when the word lines are not grouped (NO GROUPING), a voltage of 0.3V may be applied to all word lines.

However, when the word lines are grouped during the erase operation (GROUPING), the voltages of different levels for each group may be applied to the word lines.

In FIG. 8B, during the erase operation, a voltage of 0.6V may be applied to the word lines of the eleventh group GROUP11, a voltage of 0.5V may be applied to the word lines of the twelfth group GROUP12, a voltage of 0.4V may be applied to the word lines of the thirteenth group GROUP13, a voltage of 0.3V may be applied to the word lines of the fourteenth group GROUP14, a voltage of 0.2V may be applied to the word lines of the fifteenth group GROUP15, and a voltage of 0.1V may be applied to the word lines of the sixteenth group GROUP16. That is, the voltage level applied to the word lines of each group may increase from the upper portion to the lower portion in the string.

In an embodiment, during the erase operation, the memory device 100 of FIG. 1 may divide the word lines into the plurality of groups, apply the voltages of different levels for each group, and reflect an offset voltage to each voltage based on the number of times the erase operation is performed.

A method of setting the offset voltage is described in more detail with reference to FIGS. 13A and 13B.

Figure 9A:
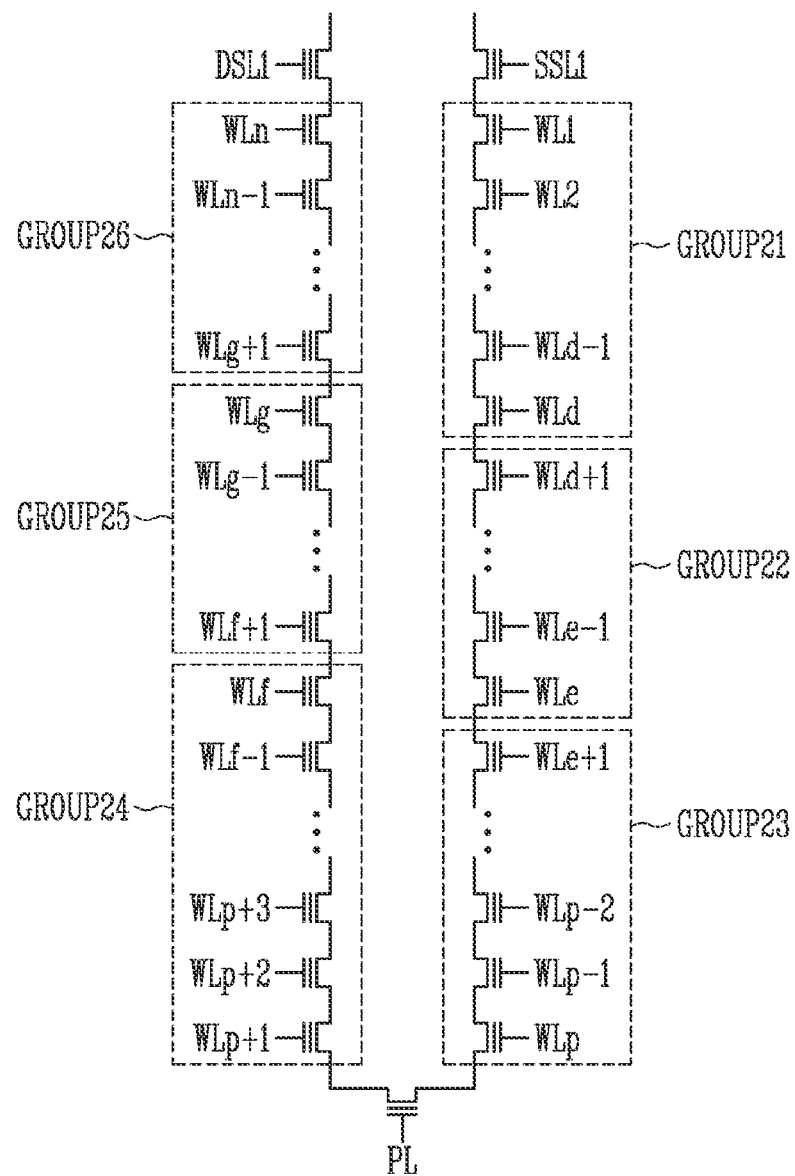

FIGS. 9A and 9B are diagrams illustrating the voltage applied to the word lines during the erase operation in the memory cell array structure of FIG. 6.

Referring to FIGS. 6, 9A, and 9B, FIG. 9A is a diagram in which the plurality of word lines WL1 to WLn connected to the memory cells of the cell string CS11' among the cell strings CS11' to CS1m' of a first row of FIG. 6 are configured as a plurality of groups GROUP21 to 26. FIG. 9B illustrates the voltages applied to the word lines during the erase operation, when the word lines are not grouped (NO GROUPING) or when the word lines are grouped (GROUPING). In FIG. 9A, the word lines are divided into 20twenty-first twenty-sixth groups GROUP21 to 26, that is, six groups, but may be divided into a greater number or a lower number of groups in another embodiment.

Referring to FIG. 9A, the first to n-th word lines WL1 to WLn of FIG. 9A may be the word lines connected to the gates of the first to nth memory cells MCI to MCn of FIG. 6, respectively. In addition, the gate of the drain select transistor DST of the cell string CS11' may be connected to the first drain select line DSL1, the gate of the source select transistor SST may be connected to the first source select line SSL1, and the gate of the pipe transistor PT may be connected to the pipe line PL.

As a result, the memory cells of the cell string CS11' may be configured of the first to p-th memory cells MC1 to MCp between the source select transistor SST and the pipe transistor PT and the (p+1)-th to n-th memory cells MCp+1 to MCn between the drain select transistor DST and the pipe transistor PT. Furthermore, the first to n-th memory cells MCI to MCn may be connected to the first to n-th word lines WL1 to WLn, respectively.

In FIGS. 9A and 9B, in the memory cell array structure of FIG. 6, the first to n-th word lines WL1 to WLn may be divided into the twenty-first to twenty-sixth groups GROUP21 to 26.

In FIGS. 9A and 9B, first to d-th word lines WL1 to WLd may be included in the twenty-first group GROUP21, (d+1)-th to e-th word lines WLd+1 to WLe may be included in the twenty-second group GROUP22, (e+1)-th to p-th word lines WLe+1 to WLp may be included in the twenty-third group GROUP23, (p+1)-th to f-th word lines WLp+1 to WLf may be included in the twenty-fourth GROUP24, (f+1)-th to g-th word lines WLf+1 to WLg may be included in the twenty-fifth group GROUP25, and (g+1)-th to n-th word lines WLg+1 to WLn may be included in the twenty-sixth group GROUP26.

In an embodiment, based on the pipe line PL, it may be the case that the word lines included in the twenty-first and twenty-sixth groups GROUP21 and 26 are present at the same position, the word lines included in the twenty-second and twenty-fifth groups GROUP22 and 25 are present at the same position, and the word lines included in the twenty-third and twenty-fourth groups GROUP23 and 24 are present at the same position.

In an embodiment, as the memory block has the three-dimensional structure, the width of the pillar of the three-dimensional cell strings may decrease from the upper portion to the lower portion of the three-dimensional structure. In addition, as the memory block has the three-dimensional structure, interference and disturbance occurring between the memory cells may increase.

Therefore, during the erase operation, the memory device 100 of FIG. 1 may divide the plurality of word lines connected to the memory block into the plurality of groups, and apply voltages of different levels to the word lines for each group.

In an embodiment, in the three-dimensional structure, during the erase operation, the memory device 100 of FIG. 1 may increase the voltage applied to the word line from the upper portion to the lower portion. In the three-dimensional structure, because the transfer of the charge may increase from the upper portion to the lower portion, the voltage level applied to the word line may increase from the upper portion to the lower portion during the erase operation. That is, in order to adjust the erase speed of the upper and lower memory cells, the voltages of different levels may be applied to the upper and lower word lines.

For example, referring to FIG. 9B, during the erase operation, the voltage level applied to the word lines may be increased from the twenty-first group GROUP21 to the twenty-third group GROUP23 and from the twenty-sixth group GROUP26 to the twenty-fourth group GROUP24.

Referring to FIG. 9B, a first column of FIG. 9B shows a word line group GROUP, a second column shows the voltage applied to the word lines when the word lines are not grouped during the erase operation (NO GROUPING), and a third column shows the voltage applied to the word lines when the word lines are grouped during the erase operation (GROUPING).

In an embodiment, when the word lines are not grouped during the erase operation (NO GROUPING), a voltage of the same level may be applied to all word lines, that is, the word lines included in the twenty-first to twenty-sixth groups GROUP21 to 26. In FIG. 9B, when the word lines are not grouped (NO GROUPING), a voltage of 0.3V may be applied to all word lines.

However, when the word lines are grouped during the erase operation (GROUPING), the voltages of different levels for each group may be applied to the word lines.

Referring to FIGS. 9A and 9B, in FIG. 9A, because the word lines of the twenty-first and twenty-sixth groups GROUP21 and 26 are present at the same position based on the pipe line PL, the same voltage of 0.1V may be applied to the word lines of the twenty-first and twenty-sixth groups GROUP21 and 26. Because the word lines of the twenty-second and twenty-fifth groups GROUP22 and 25 are present at the same position based on the pipe line PL, the same voltage of 0.2V may be applied to the word lines of the twenty-second and twenty-fifth groups GROUP22 and 25. Because the word lines of the twenty-third and twenty-fourth groups GROUP23 and 24 are present at the same position based on the pipe line PL, the same voltage of 0.3V may be applied to the word lines of the twenty-third and twenty-fourth groups GROUP23 and 24. That is, the voltage level applied to the word lines of each group may increase from the upper portion to the lower portion in the string.

In an embodiment, during the erase operation, the memory device 100 of FIG. 1 may divide the word lines into the plurality of groups, apply the voltages of different levels for each group, and reflect the offset voltage to each voltage based on the number of times the erase operation is performed.

A method of setting the offset voltage is described in more detail with reference to FIGS. 13A and 13B.

Figure 10:
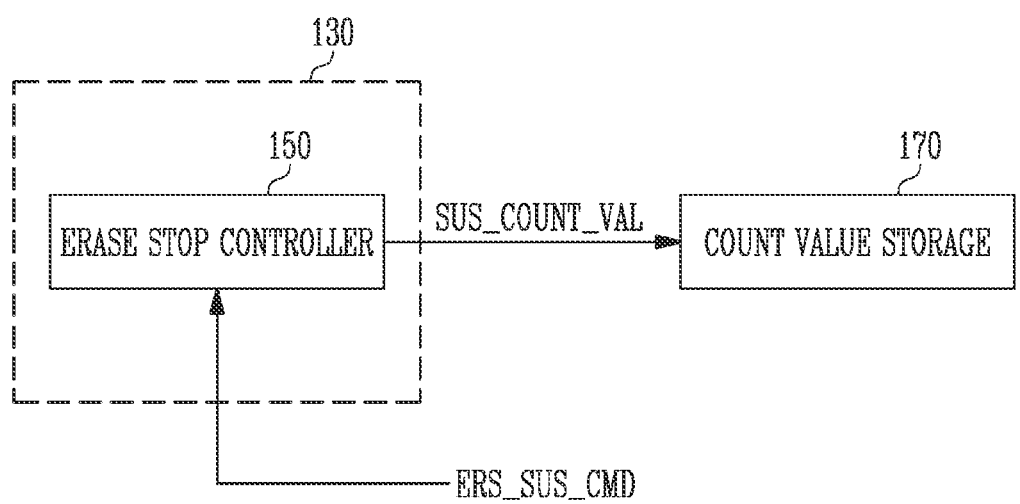
FIG. 10 is a diagram illustrating a method of storing a stop count.

FIG. 10 is a diagram illustrating a method of storing the stop count.

Referring to FIGS. 2 and 10, FIG. 10 illustrates the erase stop controller 150 and the count value storage 170, which are some of the components included in the memory device 100 of FIG. 2. Each of the erase stop controller 150 and the count value storage 170 may be included in the control logic 130 or might not be included in the control logic 130 and may be positioned outside the control logic 130. However, in the present drawing, it is assumed that only the erase stop controller 150 is included in the control logic 130.

As described above, due to the interference or disturbance between the memory cells in the three-dimensional memory block structure, during the erase operation, it is necessary to divide the word lines into the plurality of groups and apply the word line voltages of different levels for each group.

Furthermore, as the time between the stop and the resumption of the erase operation decreases, the characteristic of the memory cells are changed, and in order to reflect the changed characteristic of the memory cells to the stopped erase operation, the memory device 100 of FIG. 7 may count the number of times the stop and the resumption of the erase operation are repeated, that is, the number of times the erase operation is stopped. Thereafter, when the stopped erase operation is resumed, the memory device 100 of FIG. 7 may determine the voltage to be applied for each word line group by reflecting the offset voltage determined based on the counted erase stop count.

In an embodiment, while the memory device 100 of FIG. 7 performs the erase operation, the memory device 100 of FIG. 7 may receive the program request PGM_REQ or the read request READ_REQ from the host 300 of FIG. 7. The memory controller 200 of FIG. 7 may output the erase stop command ERS_SUS_CMD for stopping the performing erase operation to the memory device 100 of FIG. 7 so that the operation corresponding to the program request PGM_REQ or the read request READ_REQ is first performed.

In this case, the memory device 100 of FIG. 7 may stop the erase operation, which is being performed, in response to the erase stop command ERS_SUS_CMD, and may perform the program operation corresponding to the program command PGM_CMD received from the memory controller 200 of FIG. 7 or the read operation corresponding to the read command READ_CMD received from the memory controller 200 of FIG. 7 prior to the erase operation.

For example, the erase stop controller 150 may receive the erase stop command ERS_SUS_CMD output from the memory controller 200 of FIG. 7 and perform an operation corresponding to the erase stop command ERS_SUS_CMG. That is, the erase stop controller 150 may control the peripheral circuit 120 of FIG. 2 to stop the erase operation, which is being performed, in response to the erase stop command ERS_SUS_CMD.

At this time, the erase stop controller 150 may generate a stop count value SUS_COUNT_VAL by counting the number of times the erase stop command ERS_SUS_CMD is received whenever the erase stop command ERS_SUS_CMD is received. A default value of the stop count value SUS_COUNT_VAL may be '0', and the stop count value SUS_COUNT_VAL may be incrementally increased.

That is, whenever the erase stop command ERS_SUS_CMD is received before the erase operation is completed, the erase stop controller 150 may generate the stop count value SUS_COUNT_VAL, which is increased by '1'.

The stop count value SUS_COUNT_VAL generated by the erase stop controller 150 may be output to the count value storage 170, and the count value storage 170 may store the stop count value SUS_COUNT_VAL. Here, the count value storage 170 may be configured with volatile memory or non-volatile memory.

After the erase operation is stopped in response to the erase stop command ERS_SUS_CMD, the program operation corresponding to the program command PGM_CMD received from the memory controller 200 of FIG. 7 or the read operation corresponding to the read command READ_CMD may be performed prior to the erase operation. Thereafter, when the program operation or the read operation is completed, the stopped erase operation may be performed again.

However, when the new program request or the new read request is received from the host 300 of FIG. 7 before the stopped erase operation is resumed, the program operation corresponding to the new program request or the read operation corresponding to the new read request may be performed prior to the stopped erase operation.

Furthermore, even after the stopped erase operation is resumed, when the new program request or the new read request is received from the host 300 of FIG. 7, the erase operation, which is being performed, may be stopped in response to the erase stop command ERS_SUS_CMD output from the memory controller 200 of FIG. 7. In addition, the program operation corresponding to the new program request or the read operation corresponding to the new read request may be performed prior to the stopped erase operation.

In an embodiment, until the erase operation is completed, the erase stop controller 150 may generate the stop count value SUS_COUNT_VAL incremented by '1' from the existing stop count value SUS_COUNT_VAL each time the erase stop command ERS_SUS_CMD is received. When the stopped erase operation is completed, the stop count value SUS_COUNT_VAL may be reset to '0' which is a default value.

Figure 11:
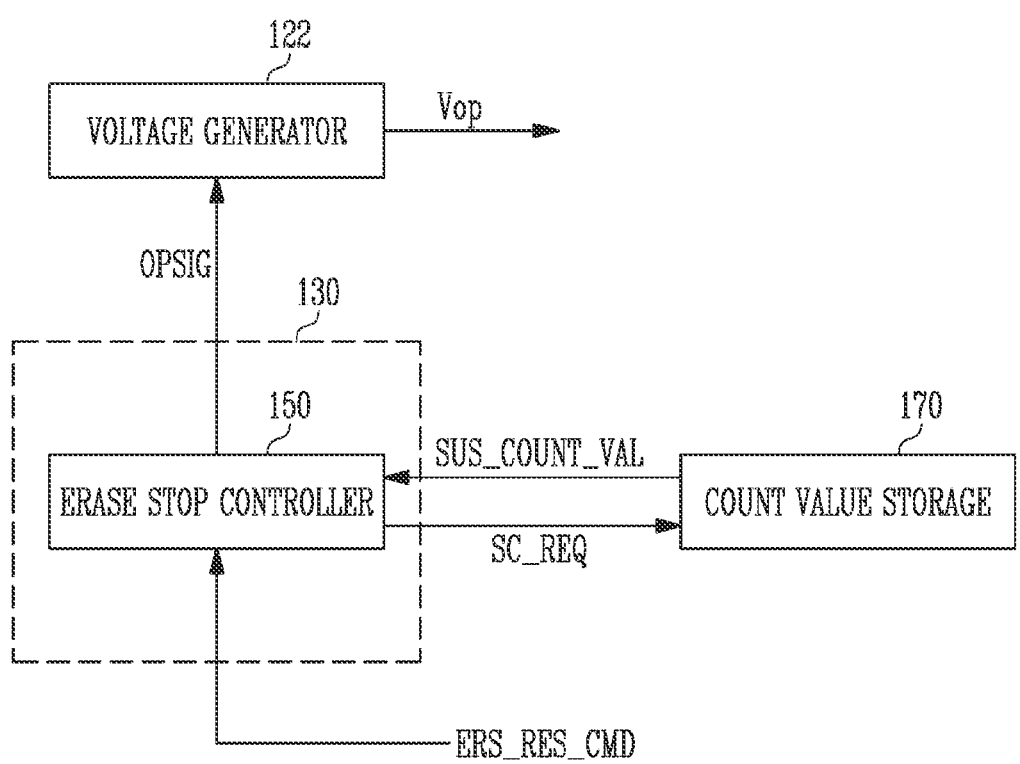
FIG. 11 is a diagram illustrating a method of resuming the erase operation based on the stop count value when the erase operation is resumed.

FIG. 11 is a diagram illustrating a method of resuming the erase operation based on the stop count value when the erase operation is resumed.

Referring to FIGS. 2 and 11, FIG. 11 illustrates the voltage generator 122, the erase stop controller 150, and the count value storage 170, which are some of the components included in the memory device 100 of FIG. 2. Each of the erase stop controller 150 and the count value storage 170 may be included in the control logic 130 or might not be included in the control logic 130 and may be positioned outside the control logic 130. However, in the present drawing, it is assumed that only the erase stop controller 150 is included in the control logic 130.

FIG. 11 illustrates a process in which the erase operation is stopped in response to the erase stop command ERS_SUS_CMD of FIG. 10, the program operation or the read operation is performed prior to the erase operation, and then the erase operation is resumed.

In an embodiment, after the erase operation is stopped, when the program operation or the read operation performed prior to the erase operation is completed, the memory device 100 of FIG. 7 may receive the erase resumption command ERS_RES_CMD from the memory controller 200 of FIG. 7.

The erase resumption command ERS_RES_CMD may be a command instructing to perform the stopped erase operation again.

The erase stop controller 150 may perform an operation for performing the stopped erase operation again in response to the erase resumption command ERS_RES_CMD. When the stopped erase operation is resumed, the memory device 100 of FIG. 7 may determine the voltage to be applied for each word line group by reflecting the offset voltage determined based on the counted the number of times the erase operation is stopped.

For example, when the erase stop controller 150 receives the erase resumption command ERS_RES_CMD from the memory controller 200 of FIG. 7, the erase stop controller 150 may output a stop count request SC_REQ for obtaining the stop count value SUS_COUNT_VAL to the count value storage 170. The stop count value SUS_COUNT_VAL may indicate the number of times the erase operation is stopped. The count value storage 170 may output the stored stop count value SUS_COUNT_VAL to the erase stop controller 150 in response to the stop count request SC_REQ.

In an embodiment, the erase stop controller 150 may control the voltage generator 122 to generate a voltage for resuming the stopped erase operation based on the received stop count value SUS_COUNT_VAL. For example, the erase stop controller 150 may control the voltage generator 122 to generate the voltage to be applied to the plurality of word lines connected to the memory block on which the erase operation is stopped.

At this time, the erase stop controller 150 may output an operation signal OPSIG to the voltage generator 122 based on the stop count value SUS_COUNT_VAL. The operation signal OPSIG may be a signal instructing to generate the voltage to be applied to the word line group and the word lines based on the number of times the erase operation is stopped in the three-dimensional memory block structure. In an embodiment, the erase stop controller 150 may control the voltage generator 122 to generate the voltage applied to the word lines connected to the memory block on which erase operation is stopped by increasing the offset voltage as the number of times the erase operation is stopped increases.

The voltage generator 122 may generate various operation voltages Vop used for the erase operation in response to the operation signal OPSIG. At this time, the operation voltages Vop may be voltages reflecting the three-dimensional memory block structure and the number of times the erase operation is stopped. For example, the operation voltages Vop may have different levels for each word line group and different levels for each number of times the erase operation is stopped. Specifically, in one string, the voltage level applied to the word line group may increase from the upper portion to the lower portion, and the voltage level applied to the word line group may increase as the number of times the erase operation is stopped increases.

In an embodiment, the operation voltages Vop generated by the voltage generator 122 may be supplied to the memory cell array 110 of FIG. 2 by the row decoder 121 of FIG. 2.

FIG. 12 is a diagram illustrating the offset voltage determined according to a section to which the stop count value belongs.

Referring to FIG. 12, a first column of FIG. 12 shows the stop count value SUS_COUNT_VAL and a second column shows the offset voltage VOFFSET determined according to the section to which the stop count value SUS_COUNT_VAL belongs. The stop count value SUS_COUNT_VAL may indicate the number of times the erase operation, which is being performed on the memory device 100 of FIG. 7, is stopped, and the offset voltage VOFFSET may indicate an offset of the voltage to be applied to the word lines connected to the memory block on which the erase operation is performed.

In FIG. 12, the section to which the stop count value SUS_COUNT_VAL belongs is configured of 4 sections, but in another embodiment, the section to which the stop count value SUS_COUNT_VAL belongs may be further subdivided.

In an embodiment, while the memory device 100 of FIG. 7 performs the erase operation, the memory device 100 may receive the program command PGM_CMD or the read command READ_CMD from the memory controller 200 of FIG. 7. At this time, the memory device 100 of FIG. 7 may stop the erase operation and first perform the program operation corresponding to the program command PGM_CMD or the read operation corresponding to the read command READ_CMD. When the program operation or the read operation is ended, the stopped erase operation may be performed again.

However, when the new program command PGM_CMD or the new read command READ_CMD is received again from the memory controller 200 of FIG. 7, the resumed erase operation may be stopped again.

In an embodiment, as a program operation speed and a read operation speed increase, the time after the erase operation is stopped until the erase operation is resumed may be shortened. In addition, as the time after the erase operation is stopped until the erase operation is resumed is shortened, the stop and the resumption of the erase operation may be repeatedly performed.

Therefore, as the stopping and the resumption of the erase operation are repeatedly performed, the charge transfer characteristic of the memory cells may be changed. When the charge transfer characteristic of the memory cells are changed, the channel characteristic of the memory cells may have a negative field or a positive field.

In order to reflect the change in the charge transfer characteristic to the stopped erase operation, when resuming the stopped erase operation, the offset voltage VOFFSET of the voltage to be applied to the word lines connected to the memory block may be set based on the stop count value SUS_COUNT_VAL.

Referring to FIG. 12, when the stop count value SUS_COUNT_VAL is less than 100, the offset voltage VOFFSET may be '0'. That is, the offset voltage VOFFSET may be set only when the stop count value SUS_COUNT_VAL is equal to or greater than 100.

In an embodiment, when the stop count value SUS_COUNT_VAL is greater than or equal to 100 and less than 300, the offset voltage VOFFSET may be Vsa. For example, when the stopped erase operation is resumed, a voltage of a level, which is higher by Vsa than the voltage level to be applied to the word lines connected to the memory block on which the erase operation is stopped, may be applied, when the channel characteristic of the memory cells is changed to the negative field. However, when the channel characteristic of the memory cells is changed to the positive field, a voltage of a level, which is lower by Vsa than the voltage level to be applied to the word lines connected to the memory block on which the erase operation is stopped, may be applied.

In an embodiment, when the stop count value SUS_COUNT_VAL is greater than or equal to 300 and less than 500, the offset voltage VOFFSET may be Vsb. For example, when the stopped erase operation is resumed, a voltage of a level, which is higher by Vsb than the voltage level to be applied to the word lines connected to the memory block on which the erase operation is stopped, may be applied, when the channel characteristic of the memory cells is changed to the negative field. However, when the channel characteristic of the memory cells is changed to the positive field, a voltage of a level, which is lower by Vsb than the voltage level to be applied to the word lines connected to the memory block on which the erase operation is stopped, may be applied.

In an embodiment, when the stop count value SUS_COUNT_VAL is greater than or equal to 700, the offset voltage VOFFSET may be Vsc. For example, when the stopped erase operation is resumed, a voltage of a level, which is higher by Vsc than the voltage level to be applied to the word lines connected to the memory block on which the erase operation is stopped, may be applied, when the channel characteristic of the memory cells is changed to the negative field. However, when the channel characteristic of the memory cells is changed to the positive field, a voltage of a level, which is lower by Vsc than the voltage level to be applied to the word lines connected to the memory block on which the erase operation is stopped, may be applied.

Here, as the stop count value SUS_COUNT_VAL increases, the offset voltage VOFFSET may increase. For example, the offset voltage VOFFSET may increase from Vsa to Vsc in the second column of FIG. 12. That is, as the number of times the erase operation is stopped increases, because a degree of freedom of the memory cell charges is relatively increased and mobility of the charges increases, the voltage applied to the word lines may increase.

FIGS. 13A and 13B are diagrams illustrating the voltage applied to each word line group according to the section to which the stop count value belongs and whether or not grouping is performed.

Referring to FIGS. 8A, 8B, 9A, 9B, 12, 13A, and 13B, FIG. 13A shows the voltage reflecting the offset voltage VOFFSET of FIG. 12 for each word line group in the memory cell array structure of FIG. 8A. FIG. 13B shows a voltage reflecting the offset voltage VOFFSET of FIG. 12 for each word line group in the memory cell array structure of FIG. 9A. In FIGS. 13A and 13B, a first column shows a group GROUP dividing the word lines connected to the memory block, a second column shows the voltage applied to the word lines of each group when the erase operation is resumed when the word lines are not grouped (NO GROUPING), and a third column shows the voltage applied to the word lines of each group when the erase operation is resumed when the word lines are grouped (GROUPING).

In FIGS. 13A and 13B, the word lines are divided into six groups, but in another embodiment, the word lines may be divided into a greater number or a lower number of groups.

Referring to FIG. 13A, FIG. 13A illustrates the voltages applied to the word lines connected to the memory block on which the erase operation is stopped when the number of times the erase operation is stopped is greater than or equal to 100 and less than 300. That is, FIG. 13A illustrates the voltages applied to the word lines when the erase operation is resumed in a case where the stop count value SUS_COUNT_VAL is greater than or equal to 100 and less than 300. Similarly to FIG. 12, in FIG. 13A, when the number of times the erase operation is stopped is greater than or equal to 100 and less than 300, it Is assumed that the offset voltage VOFFSET is Vsa.

In FIGS. 8A and 8B, the first to n-th word lines WL1 to WLn may be grouped (GROUPING) or not grouped (NO GROUPING). In an embodiment, when the first to n-th word lines WL1 to WLn are grouped into the plurality of groups (GROUPING), during the erase operation, different voltages for each group may be applied to the word lines. However, when the first to n-th word lines WL1 to WLn are not grouped (NO GROUPING), during the erase operation, the voltage of the same level may be applied to all word lines.

Therefore, referring to FIGS. 8A, 8B, and 13A, in FIG. 13A, the number of times the erase operation is stopped on the memory block on which the erase operation is performed is greater than or equal to 100 and less than 300, and the first to n-th word lines WL1 to WLn might not be grouped into the plurality of groups (NO GROUPING). At this time, during the erase operation, when the channel characteristic of the memory cells is changed to the negative field, 0.3V+Vsa voltage may be applied to all groups GROUP11 to 16, and when the channel characteristic of the memory cells is changed to the positive field, 0.3V−Vsa voltage may be applied to all groups GROUP11 to 16.

However, when the first to n-th word lines WL1 to WLn are grouped into the plurality of groups (GROUPING), voltages of different levels may be applied for each group.

For example, when the channel characteristic of the memory cells is changed to the negative field, 0.6V+Vsa voltage may be applied to the word lines of the eleventh group GROUP11, 0.5V+Vsa voltage may be applied to the word lines of the twelfth group GROUP12, 0.4V+Vsa voltage may be applied to the word lines of the thirteenth group GROUP13, 0.3V+Vsa voltage may be applied to the word lines of the fourteenth group GROUP14, 0.2V+Vsa voltage may be applied to the word lines of the fifteenth group GROUP15, and 0.1V+Vsa voltage may be applied to the word lines of the sixteenth group GROUP16.

Conversely, when the channel characteristic of the memory cells is changed to the positive field, 0.6V−Vsa voltage may be applied to the word lines of the eleventh group GROUP11, 0.5V−Vsa voltage may be applied to the word lines of the twelfth group GROUP12, 0.4V−Vsa voltage may be applied to the word lines of the thirteenth group GROUP13, 0.3V−Vsa voltage may be applied to the word lines of the fourteenth group GROUP14, 0.2V−Vsa voltage may be applied to the word lines of the fifteenth group GROUP15, and 0.1V−Vsa voltage may be applied to the word lines of the sixteenth group GROUP16.

Referring to FIG. 13B, FIG. 13B illustrates the voltages applied to the word lines connected to the memory block on which the erase operation is stopped when the number of times the erase operation is stopped is greater than or equal to 300 and less than 500. That is, FIG. 13B shows the voltages applied to the word lines when the erase operation is resumed in a case where the stop count value SUS COUNT VAL is greater than or equal to 300 and less than 500. Similarly to FIG. 12, in FIG. 13B, when the number of times the erase operation is stopped is greater than or equal to 300 and less than 500, it is assumed that the offset voltage VOFFSET is Vsb.

In FIGS. 9A and 9B, the first to n-th word lines WL1 to WLn may be grouped (GROUPING) or not grouped (NO GROUPING). In an embodiment, when the first to n-th word lines WL1 to WLn are grouped into the plurality of groups (GROUPING), during the erase operation, different voltages may be applied to the word lines for each group. However, when the first to n-th word lines WL1 to WLn are not grouped (NO GROUPING), during the erase operation, the voltage of the same level may be applied to all word lines.

Therefore, referring to FIGS. 8A, 8B, and 13B, in FIG. 13B, the number of times the erase operation is stopped on the memory block on which the erase operation is performed is greater than or equal to 300 and less than 500, and the first to n-th word lines WL1 to WLn might not be grouped into the plurality of groups (NO GROUPING). At this time, during the erase operation, when the channel characteristic of the memory cells is changed to the negative field, 0.3V+Vsb voltage may be applied to all groups GROUP21 to 26, and when the channel characteristic of the memory cells is changed to the positive field, 0.3V−Vsb voltage may be applied to all groups GROUP21 to 26.

However, when the first to n-th word lines WL1 to WLn are grouped into the plurality of groups (GROUPING), voltages of different levels may be applied for each group.

For example, when the channel characteristic of the memory cells is changed to the negative field, 0.1V+Vsb voltage may be applied to the word lines of the twenty-first group GROUP21, 0.2V+Vsb voltage may be applied to the word lines of the twenty-second group GROUP22, 0.3V+Vsb voltage may be applied to the word lines of the twenty-third group GROUP23, 0.3V+Vsb voltage may be applied to the word lines of the twenty-fourth group GROUP24, 0.2V+Vsb voltage may be applied to the word lines of the twenty-fifth group GROUP25, and 0.1V+Vsb voltage may be applied to the word lines of the twenty-sixth group GROUP26.

Conversely, when the channel characteristic of the memory cells is changed to the positive field, 0.1V−Vsb voltage may be applied to the word lines of the twenty-first group GROUP21, 0.2V−Vsb voltage may be applied to the word lines of the twenty-second group GROUP22, 0.3V−Vsb voltage may be applied to the word lines of the twenty-third group GROUP23, 0.3V−Vsb voltage may be applied to the word lines of the twenty-fourth group GROUP24, 0.2V−Vsb voltage may be applied to the word lines of the twenty-fifth group GROUP25, and 0.1V−Vsb voltage may be applied to the word lines of the twenty-sixth group GROUP26.

In FIGS. 13A and 13B, the offset voltage VOFFSET is identically applied to all word line groups, but in another embodiment, the offset voltage VOFFSET may be applied differently for each word line group. For example, the offset voltage VOFFSET may increase or decrease from the upper portion to the lower portion in the three-dimensional memory block structure. That is, the offset voltage VOFFSET may be differently set according to the position of the word line.

FIG. 14 is a diagram illustrating an operation of the memory device according to an embodiment of the present disclosure.

Referring to FIG. 14, in step S1401, the memory device may perform the erase operation. The erase operation is an operation corresponding to the erase command received from the memory controller, and may be an operation of erasing data stored in the memory cells of any one of the plurality of memory blocks included in the memory device.

In step S1403, the memory device may receive the program command or the read command while performing the erase operation. For example, while the memory device performs the erase operation, the memory controller may receive the program request or the read request from the host and output the program command corresponding to the program request or the read command corresponding to the read request, and the memory device may receive the program command or the read command.

In step S1405, the memory device may stop the erase operation, which is being performed, and count the number of times the erase operation is stopped. That is, the memory device may stop the erase operation in order to perform the program operation corresponding to the program command received while performing the erase operation or the read operation corresponding to the read command prior to the erase operation.

Furthermore, when the erase operation is resumed, the memory device may count the number of times the erase operation is stopped to reflect the offset voltage determined based on the number of times the erase operation is stopped.

Thereafter, in step S1407, the memory device may perform the program operation or the read operation prior to the erase operation.

In step S1409, when the program operation or the read operation performed prior to the erase operation is completed, the memory device may determine whether the new program command or the new read command is received from the memory controller. When the new program command or the new read command is received from the memory controller (Y), the memory device may proceed to step S1405 to stop the erase operation again (to maintain the erase operation stop state), and may perform the program operation corresponding to the new program command or the read operation corresponding to the new read command.

That is, when the new program command or the erase command is received from the memory controller after the erase operation is stopped, the stop state of the erase operation may be maintained, and when the new program command or the erase command is received from the memory controller after the stopped erase operation is resumed, the memory device may stop the erase operation again.

However, when the new program command or the new read command is not received from the memory controller (N), the memory device may proceed to step S1411 to perform the stopped erase operation again.

In step S1411, the memory device may resume the stopped erase operation based on the counted number of times the erase operation is stopped. For example, the memory device may determine the offset voltage according to the section to which the counted number of times the erase operation is stopped belongs, and apply the voltage higher by the offset voltage to the word lines to be connected to the memory block on which the erase operation is performed.

Thereafter, in step S1413, it may be determined whether the resumed erase operation is completed. When the resumed erase operation is not completed (N), the memory device may proceed to step S1409 to determine whether to stop the performing erase operation according to whether the new program command or the new read command is received from the memory controller.

Figure 15:
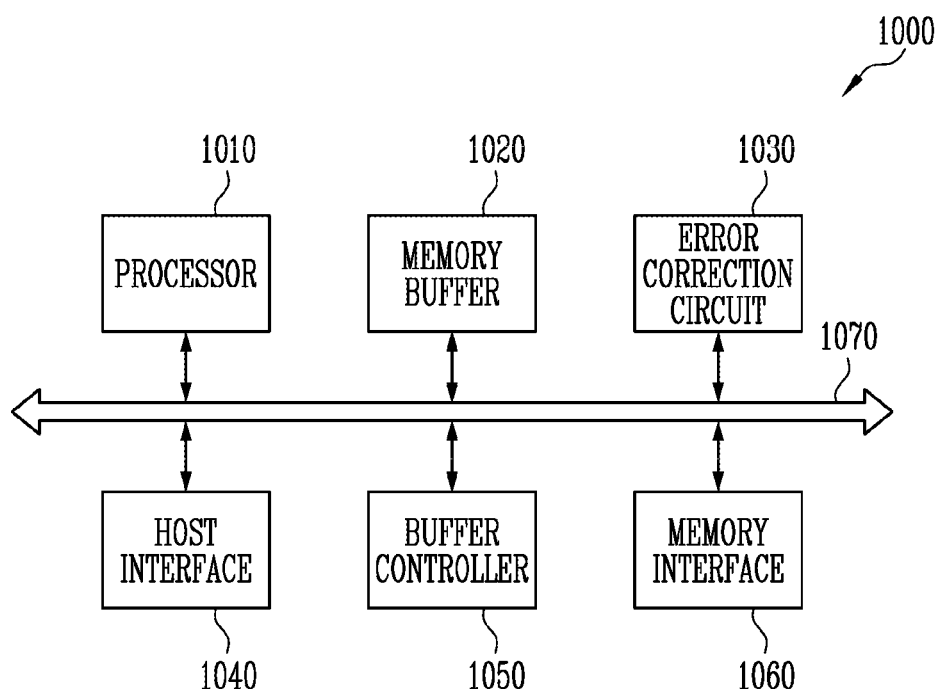
FIG. 15 is a diagram illustrating another embodiment of the memory controller of FIG. 1.

FIG. 15 is a diagram illustrating another embodiment of the memory controller 200 of FIG. 1.

The memory controller 1000 of FIG. 15 is connected to a host and the memory device. The memory controller 1000 is configured to access the memory device in response to a request from the host Host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 15, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as operation memory, cache memory, or buffer memory of the processor 1010. The memory buffer 1020 may store codes and commands executed by the processor 1010. The memory buffer 1020 may store data processed by the processor 1010. The memory buffer 1020 may include static RAM (SRAM) or dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in the memory interface 1060 as a component of the memory interface 1060.

The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection express (PCI-E), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other so as not to interfere with each other or affect each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1020, and the memory interface 1060.

Figure 16:
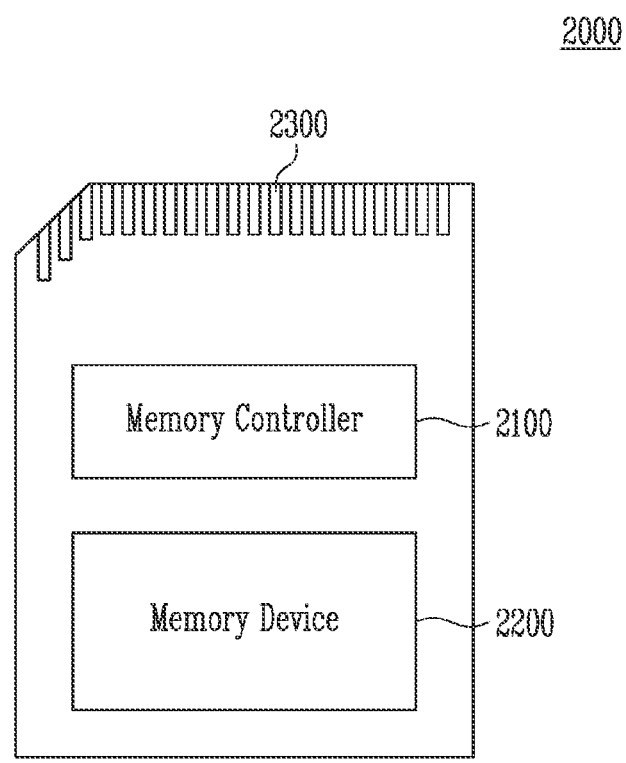
FIG. 16 is a block diagram illustrating a memory card system to which the storage device according to an embodiment of the present disclosure is applied.

FIG. 16 is a block diagram illustrating a memory card system 2000 to which the storage device according to an embodiment of the present disclosure is applied.

Referring to FIG. 16, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented equally to the memory device 100 of FIG. 1 described with reference to FIG. 2.

As an example, the memory controller 2100 may include components such as a random access memory (RAM), a processor, a host interface, a memory interface, and an error correction circuit.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Bluetooth, and an NVMe. As an example, the connector 2300 may be defined by at least one of the various communication standards described above.

As an example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

In an embodiment, when the memory device 2200 receives the program command or the read command from the memory controller 2100 while performing the erase operation, the memory device 2200 may stop the performing erase operation. That is, the program operation or the read operation may be performed prior to the erase operation.

Thereafter, when the memory device 2200 does not receive the new program command or the new read command, the memory device 2200 may perform the stopped erase operation again. However, when the memory device 2200 receives the new program command or the new read command while the erase operation is stopped, or when the memory device 2200 receives the new program command or the new read command after the erase operation is resumed, the erase operation may be stopped again.

In an embodiment, when the stopped erase operation is performed again, the memory device 2200 may determine the offset voltage based on the number of times the erase operation is stopped.

In an embodiment, as the program operation speed and the read operation speed increase, the time after the erase operation is stopped until the erase operation is resumed may be shortened. In addition, as the time after the erase operation is stopped until the erase operation is resumed is shortened, the stop and the resumption of the erase operation may be repeatedly performed. Therefore, as the stop and the resumption of the erase operation are repeatedly performed, the charge transfer characteristic of the memory cells may be changed.

In order to reflect the change in the charge transfer characteristic to the stopped erase operation, when resuming the stopped erase operation, the offset voltage may be determined based on the number of times the erase operation is stopped. At this time, as the number of times the erase operation is stopped is increased, the offset voltage may increase. In an embodiment, the level of the offset voltage may be identically applied to all word lines or may be set differently for each word line group.

Figure 17:
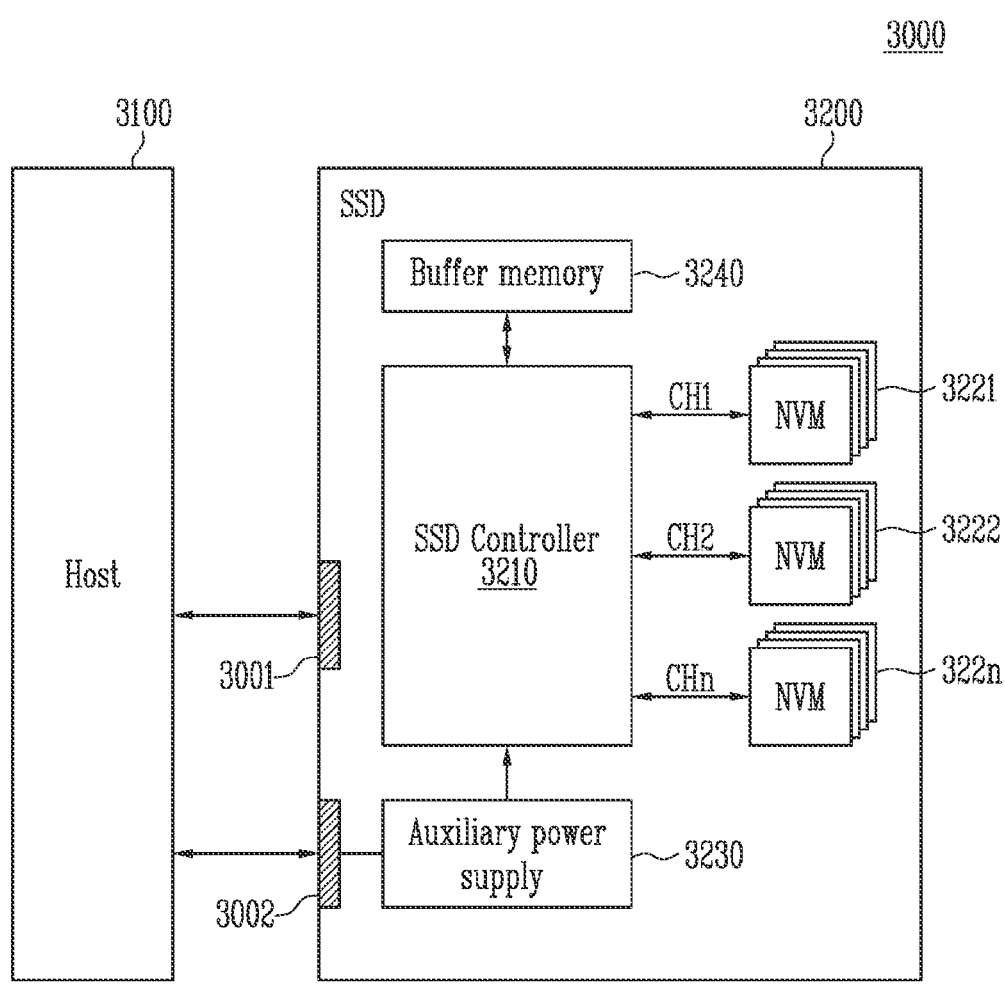
FIG. 17 is a block diagram illustrating a solid state drive (SSD) system to which the storage device according to an embodiment of the present disclosure is applied.

FIG. 17 is a block diagram illustrating a solid state drive (SSD) system 3000 to which the storage device according to an embodiment of the present disclosure is applied.

Referring to FIG. 17, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (DE), FireWire, a universal flash storage (UFS), Wi-Fi, Bluetooth, and an NVMe.

In an embodiment, when any one of the flash memories 3221 to 322n receives the program command or the read command from the SSD controller 3210 while performing the erase operation, the corresponding flash memory may stop the performing erase operation. That is, the program operation or the read operation may be performed prior to the erase operation.

Thereafter, when the corresponding flash memory does not receive the new program command or the new read command, the corresponding flash memory may perform the stopped erase operation again. However, when the corresponding flash memory receives the new program command or the new read command while the erase operation is stopped, or when the corresponding flash memory receives the new program command or the new read command after the erase operation is resumed, the erase operation may be stopped again.

In an embodiment, when the stopped erase operation is performed again, the corresponding flash memory may determine the offset voltage based on the number of times the erase operation is stopped.

In an embodiment, as the program operation speed and the read operation speed increase, the time after the erase operation is stopped until the erase operation is resumed may be shortened. In addition, as the time after the erase operation is stopped until the erase operation is resumed is shortened, the stop and the resumption of the erase operation may be repeatedly performed. Therefore, as the stop and the resumption of the erase operation are repeatedly performed, the charge transfer characteristic of the memory cells may be changed.

In order to reflect the change in the charge transfer characteristic to the stopped erase operation, when resuming the stopped erase operation, the offset voltage may be determined based on the number of times the erase operation is stopped. At this time, as the number of times the erase operation is stopped is increased, the offset voltage may increase. In an embodiment, the level of the offset voltage may be identically applied to all word lines or may be set differently for each word line group.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include volatile memory such as DRAM, SDRAM, DDR SDRAM, LPDDR SDRAM, and GRAM, or non-volatile memory such as FRAM, ReRAM, STT-MRAM, and PRAM.

Figure 18:
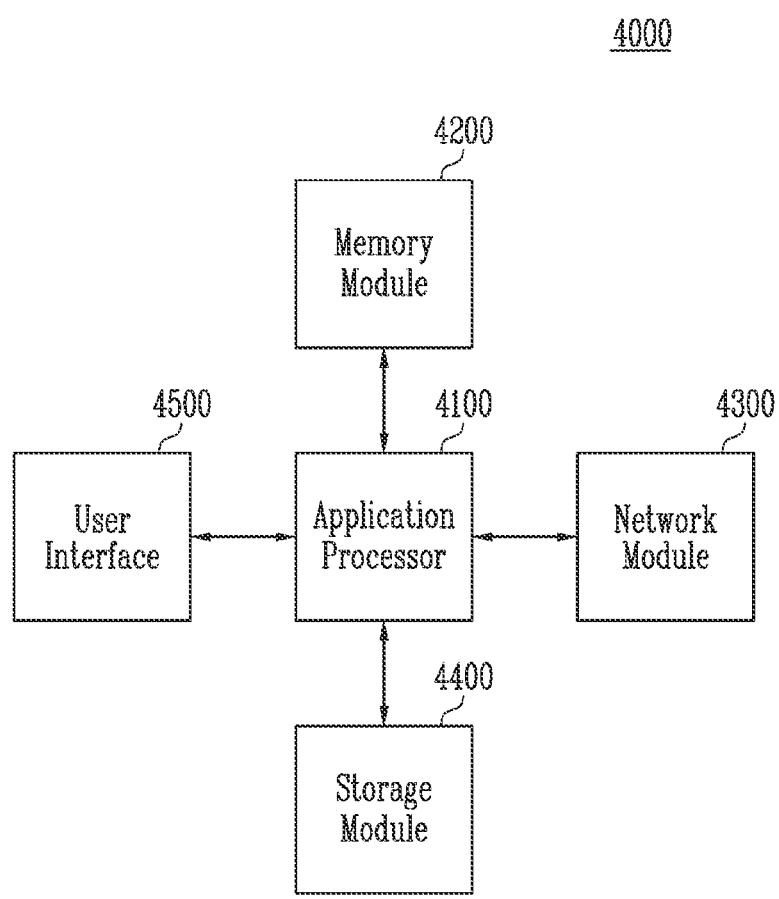
FIG. 18 is a block diagram illustrating a user system to which the storage device according to an embodiment of the present disclosure is applied.

FIG. 18 is a block diagram illustrating a user system 4000 to which the storage device according to an embodiment of the present disclosure is applied.

Referring to FIG. 18, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as main memory, operation memory, buffer memory, or cache memory of the user system 4000. The memory module 4200 may include volatile random access memory such as DRAM, SDRAM, DDR SDRAM, DDR2 SDRAM, DDR3 SDRAM, LPDDR SDARM, LPDDR2 SDRAM, and LPDDR3 SDRAM, or non-volatile random access memory, such as PRAM, ReRAM, MRAM, and FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, W max, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element including phase-change RAM (PRAM), magnetic RAM (MRAM), resistive RAM (RRAM), NAND flash, NOR flash, and three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device described with reference to FIGS. 2 and 3. The storage module 4400 may operate identically to the storage device 50 described with reference to FIG. 1.

In an embodiment, when the storage module 4400 receives the program command or the read command from the application processor 4100 while performing the erase operation, the storage module 4400 may stop the performing erase operation. That is, the program operation or the read operation may be performed prior to the erase operation.

Thereafter, when the storage module 4400 does not receive the new program command or the new read command, the storage module 4400 may perform the stopped erase operation again. However, when the storage module 4400 receives the new program command or the new read command while the erase operation is stopped, or when the storage module 4400 receives the new program command or the new read command after the erase operation is resumed, the erase operation may be stopped again.

In an embodiment, when the stopped erase operation is performed again, the storage module 4400 may determine the offset voltage based on the number of times the erase operation is stopped.

In an embodiment, as the program operation speed and the read operation speed increase, the time after the erase operation is stopped until the erase operation is resumed may be shortened. In addition, as the time after the erase operation is stopped until the erase operation is resumed is shortened, the stop and the resumption of the erase operation may be repeatedly performed. Therefore, as the stop and the resumption of the erase operation are repeatedly performed, the charge transfer characteristic of the memory cells may be changed.

In order to reflect the change in the charge transfer characteristic to the stopped erase operation, when resuming the stopped erase operation, the offset voltage may be determined based on the number of times the erase operation is stopped. At this time, as the number of times the erase operation is stopped is increased, the offset voltage may increase. In an embodiment, the level of the offset voltage may be identically applied to all word lines or may be set differently for each word line group.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device including a plurality of memory blocks, the memory device comprising:
   a voltage generator configured to generate voltages used by the memory device in performing an erase operation on a selected memory block among the plurality of memory blocks;
   an erase stop controller configured to control stopping and resuming the erase operation, and counting the number of times the erase operation is stopped to generate a stop count value when the erase operation is stopped, wherein when the erase operation is resumed, the erase stop controller is configured to set, based on the stop count value, an offset voltage of voltages to be applied to word lines connected to the selected memory block while performing the erase operation; and
   a count value storage configured to store and output the stop count value.

2. The memory device of claim 1, wherein the count value storage comprises one of volatile memory cells and non-volatile memory cells.

3. The memory device of claim 1, wherein the erase stop controller is configured to control a peripheral circuit of the memory device to stop the erase operation when the erase stop controller receives one of a program command and a read command from a memory controller while performing the erase operation.

4. The memory device of claim 3, wherein the erase stop controller is configured to:
  maintain the stopped state of the erase operation when the erase stop controller receives one of a new program command and a new read command from the memory controller after the erase operation is stopped; and
  stop the erase operation again when the erase stop controller receives one of another program command and another read command from the memory controller after the stopped erase operation is resumed.

5. The memory device of claim 3, wherein the erase stop controller is configured to:
  set the offset voltage to be greater as the stop count value increases; and
  set the offset voltage to be less as the stop count value decreases.

6. The memory device of claim 3, wherein each of the plurality of memory blocks has a three-dimensional structure and the erase stop controller is configured to set the offset voltage differently according to positions of the word lines connected to the selected memory block.

7. The memory device of claim 3, wherein each of the plurality of memory blocks has a three-dimensional structure and when the word lines connected to the selected memory block are divided into a plurality of groups, the erase stop controller is configured to control the voltage generator to generate a voltage higher than a word line voltage set for each of the plurality of groups by the offset voltage.

8. The memory device of claim 3, wherein each of the plurality of memory blocks has a three-dimensional structure and when the word lines connected to the selected memory block are included in one group, the erase stop controller is configured to control the voltage generator to generate a voltage higher than the voltage to be applied to the word lines connected to the selected memory block by the offset voltage.

9. The memory device of claim 1, wherein:
  the erase stop controller is configured to output a stop count request, for obtaining the stop count value, to the count value storage so that the erase operation is resumed based on the stop count value after the erase operation is stopped; and
  the count value storage is configured to output the stored stop count value as the stop count value in response to the stop count request.

10. A method of operating a memory device including a plurality of memory blocks, the method comprising:
  performing an erase operation on a selected memory block among the plurality of memory blocks;
  stopping the erase operation when a program command or a read command is received while performing the erase operation;
  counting the number of times the erase operation is stopped to generate a stop count value when the erase operation is stopped; and
  resuming the erase operation based on the stop count value after an operation corresponding to the program command or the read command is completed, wherein resuming the erase operation comprises setting, based on the stop count value, an offset voltage of voltages to be applied to word lines connected to the selected memory block while performing the erase operation.

11. The method of claim 10, wherein setting the offset voltage comprises: setting the offset voltage to be greater as the stop count value increases; and setting the offset voltage to be less as the stop count value decreases.

12. The method of claim 10, wherein setting the offset voltage, when each of the plurality of memory blocks has a three-dimensional structure, comprises setting the offset voltage differently according to positions of the word lines connected to the selected memory block.

13. The method of claim 12, wherein setting the offset voltage comprises:
  setting the offset voltage to be less when the selected memory block is positioned at an upper portion of the three-dimensional structure; and
  setting the offset voltage to be greater when the selected memory block is positioned at a lower portion of the three-dimensional structure.

14. The method of claim 12, wherein setting the offset voltage comprises:
  setting the offset voltage to be greater when the selected memory block is positioned at an upper portion of the three-dimensional structure; and
  setting the offset voltage to be less when the selected memory block is positioned at a lower portion of the three-dimensional structure.

15. The method of claim 10, wherein resuming the erase operation, when each of the plurality of memory blocks has a three-dimensional structure and the word lines connected to the selected memory block are divided into a plurality of groups, comprises applying a voltage higher than word line voltage set for each of the plurality of groups by the offset voltage.

16. The method of claim 10, wherein resuming the erase operation, when each of the plurality of memory blocks has a three-dimensional structure and the word lines connected to the selected memory block are included in one group, comprises applying a voltage higher than the voltage to be applied to the word lines connected to the selected memory block by the offset voltage.

17. The method of claim 10, further comprising storing the stop count value in volatile memory cells.

18. The method of claim 17, wherein resuming the erase operation comprises:
  outputting a stop count request for obtaining the stop count value stored in the volatile memory cells; and
  receiving the stop count value in response to the stop count request.

* * * * *